(12) United States Patent
Yang

(10) Patent No.: US 7,167,011 B2
(45) Date of Patent: Jan. 23, 2007

(54) DIFFERENTIAL MEASUREMENT PROBE HAVING RETRACTABLE DOUBLE CUSHIONED VARIABLE SPACING PROBING TIPS WITH EOS/ESD PROTECTION CAPABILITIES

(75) Inventor: Kei-Wean C. Yang, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 63 days.

(21) Appl. No.: 11/139,112

(22) Filed: May 27, 2005

(65) Prior Publication Data

US 2006/0267604 A1 Nov. 30, 2006

(51) Int. Cl.
*G01R 31/02* (2006.01)
(52) U.S. Cl. ...................... 324/754; 324/761
(58) Field of Classification Search ........ 324/754–762, 324/72.5, 133, 158.1; 439/480, 482, 578, 439/585
See application file for complete search history.

(56) References Cited

U.S. PATENT DOCUMENTS

| | | | |
|---|---|---|---|
| 4,673,839 A | * | 6/1987 | Veenendaal ................. 310/338 |
| 6,704,670 B1 | | 3/2004 | McTigue |
| 6,734,689 B1 | * | 5/2004 | Yang ........................... 324/754 |
| 7,017,435 B1 | * | 3/2006 | Pooley et al. ............... 73/866.5 |
| 7,126,360 B1 | * | 10/2006 | Yang ........................... 324/754 |

OTHER PUBLICATIONS

U.S. Appl. No. 10/856,290, filed May 27, 2004, William R. Pooley et al., "Hand-Held Probing Adapter for a Measurement Probing System".

* cited by examiner

*Primary Examiner*—Vinh P. Nguyen
(74) *Attorney, Agent, or Firm*—William K. Bucher

(57) ABSTRACT

A differential measurement probe has spring loaded, double cushioned probe assemblies and a pressure sensors disposed in a housing. The pressure sensors forms an electrical switch having an electrical AND function for passing an activation signal to a EOS/ESD protection control module in response to axial movement of the housing relative to the probe assemblies. First compressive elements produces first preloaded compressive forces and increasing compressive forces on the probe assemblies and second compressive elements produces second pre-loaded compressive forces and increasing compressive forces on the probe assemblies subsequent to the first increasing compressive forces on the probe assemblies. An adjustment member allows variable spacing of the differential probing tips.

37 Claims, 16 Drawing Sheets

DIFFERENTIAL MEASUREMENT PROBE HAVING RETRACTABLE DOUBLE CUSHIONED VARIABLE SPACING PROBING TIPS WITH EOS/ESD PROTECTION CAPABILITIES

BACKGROUND OF THE INVENTION

The present invention relates generally to signal acquisition probes and more particularly to a differential measurement probe having retractable double cushioned variable spacing probing tips with electrical over stress (EOS) and electrostatic discharge (ESD) protection capabilities.

Differential time domain reflectometry (TDR) probes are used to launch step pulses onto devices under test and receive reflected return pulses from the device. The return pulses are coupled to a sampling head which generates discrete samples of the return signal. Due to the variability of the spacing of test points on the device under test, it is desirable to provide a differential TDR probe with variable spacing probing tips. One such differential TDR probe is the A0134332 Differential TDR probe, manufactured and sold by Inter-Continental Microwave, Santa Clara, Calif. The variable spacing differential TDR probe has individual TDR probes that are mounted to a flat spring using two screws. Each TDR probe has a metallic housing with one end of the housing having a threaded connector for connecting a signal cable. A substantially rectangular member extends outward from below the connector and has a threaded aperture for receiving the screw that secures the TDR probe to the flat spring. Below the rectangular member is a circular portion that transitions into a narrow rectangular probe tip member. The probe tip member has an aperture that receives an RF pin and dielectric member. The RF pin is electrically connected to a central signal contact of the treaded connector. Additional apertures are formed in the narrow rectangular probe tip member for receiving ground pogo pins. The various apertures allow the ground pogo pins to be positioned at various distances from the RF pin. A variable spacing adjustment clamp is position over the TDR probes adjacent to the narrow rectangular probe tip members. The adjustment clamp has a "U" shaped portion and a flat portion with the two portions being secured together with screws. The two opposing sides of the "U" shaped member have threaded apertures that receive adjustment cap screws that extend through the sides of the "U" shaped member and into interior space of the "U". Treaded apertures are formed in the base of the "U" shaped member that intersect the threaded apertures in the opposing sides of the "U" shaped member. Each threaded aperture in the base receives a set screw that is tightened on the adjustment cap screws.

Positioning of the RF pins are accomplished by loosening the set screws on the adjustment cap screws and turning the adjustment cap screws to move each TDR probes closer together or farther apart. The flat spring to which the TDR probes are attached causes outward pressure on the probes to force them against the adjustment cap screws. The screws holding the TDR probes to the flat spring may also be loosened to allow rotational movement of the probes. When the RF tip and the ground pogo pins are positioned correctly, the set screws and the flat spring screws are tightened.

While the above described variable spacing TDR probe allows movement of the RF tips and the ground pogo pins, the design of the probe has drawbacks. For example, the RF pins are fixed in the TDR probes so that RF pin had no axial movement. This requires that the RF pins of the differential probe be positioned in the same lateral plane to make good contact with the device under test. If the RF tips are not in the same lateral plane, one of the RF pins will be subject to more axial force in order for the other RF pin to make contact. If this axial force is excessive, then damage can occur to one or both of the RF pins. This requires the replacement of the RF pin and the dielectric member. Further, this variable spacing differential probe does not have the capability to protect the sampling head from electrostatic voltages that may be present on the device under test. This will result in damage to the sampling circuit in the sampling head.

Ultra high speed sampling heads used in time domain reflectometry typically dictate extremely low capacitances. This introduces unique problems. Sampling devices are much more sensitive to static discharge residing on a device under test. The small geometry of the sampling diodes in the sampling head often dictate low breakdown voltages. The low parasitic capacitance at the sampling head input means that for a given device under test (DUT) static discharge, there will be a higher transient voltage at the sampler input because of the reduced charge sharing effect. It is therefore important to neutralize any static charge on the device under test before the sampling head input is coupled to the device under test.

Another type of variable spacing differential measurement probe is described in U.S. Pat. No. 6,704,670. The variable spacing measurement probe has first and second typically cylindrical probe barrel. Each probe barrel is constructed of an electrically conductive material that extends partially outside of a probe unit housing. A probe barrel nose cone is attached to each of the exposed probe barrels. Each probe nose cone is generally conical in form and made of an insulating material. The longitudinal axis of each probe barrel nose cone extends from the probe barrel at an offset angle from the longitudinal axis of the probe barrel. A typically cylindrical shaped probe tip extends partially out of the end of each probe barrel nose cone and is make of an electrically conductive material. A probe cable having an outer shielding conductor and a central signal conductor is connected to each of the probe barrels and the probe tips with the outer shielding conductor being connected to the probe barrel and the signal conductor being connected to the probe tip. An elastic compressible element engages each probe barrel and the probe unit housing allowing movement of the probe barrels into and out of the probe unit housing. The offset longitudinal axes of the probe nose cones and associated probe relative to the longitudinal axes of the probe barrels allows variable spacing of the probe tips.

The forces exerted on the probe barrel and probe nose cone assemblies are shown graphically in FIG. 1. The '670 patent shows the elastic compressible elements as compression springs following Hook's Law of $F=K_1 \Delta X$ where $K_1$ is the compression spring constant. FIG. 1 shows the forces applied to each of the probe nose cone and probe barrel assemblies during use, where "F" is the force applied to the probe tip of the probe nose cone and $\Delta X$ is the spring compression. Assuming that the elastic compressible elements are pre-loaded, there in an initial force on the assemblies as represented by the force $F_1$. Downward force on the probe unit housing exerts an increasing force on the assemblies as represented by the sloping line $K_1$. Continued downward force on the probe unit housing causes the elastic compressible elements are completely compress or the assemblies engage a fixed. Continued downward pressure on the probe unit housing transfers forces to the assemblies as represented by the vertical force line. The above described differential measurement probe is used for measuring signal from a device under test. As such, the differential measurement probe has passive input circuitry the lessens the need for EOS/ESD protection. Therefore, these probes do not ground the signal input to discharge electrostatic voltages on the device under test.

A further variable spacing differential measurement probe is the P7380 Differential Measurement Probe, manufactured and sold by Tektronix, Inc. Beaverton, Oreg. The P7380 probe has a probe body containing active circuitry and a probe tip member connected to the probe body by two coaxial cables. The probe tip member has differential probing contacts that mate with various probing tips mounted in a tip clip. One of the tip clips has rotatable probing tips that provides variable spacing for the probing tips. The probe body and the probe tip member may by positioned in a hand-held probing adapter housing that provides for easy hand-held probing by the P7380 as described in U.S. patent application Ser. No. 10/856,290, filed on May 27, 2004. The probe tip member is positioned in a cavity at the front of the hand-held probing adapter with a portion of the probe tip member extending past the end of the hand-held probing adapter. Within the cavity are compliant members formed of an elastomeric material that abut the side surfaces and rearward surfaces of the probe tip member. As the differential probing tips are brought into contact with a device under test, any non-planar variation between the probing tips and the device under test is taken up by the compliant members. The forces exerted on the probing tips of the probe tip member are shown graphically in FIG. 1. The compliant members are preferably formed of elastomeric material that are partially compressed by the probe tip member producing an initial pre-load condition as represented by the force $F_1$. Downward pressure on the probe tip member exerts an increasing force on one or both of the probing tips as a result of the compressive characteristics of the elastomeric material as represented by force $K_1$. Continued downward pressure on the probe tip member completely compresses the elastomeric material or the or the probe tip member engages a fixed stop. Continued downward pressure on the probe tip unit transfers forces to the probing tips as represented by the vertical force line. As with the previously describe variable spacing differential probe, the above described variable spacing differential measurement probe is used for measuring signal from a device under test. As such, the variable spacing differential measurement probe has passive input circuitry the lessens the need for EOS/ESD protection. Therefore, these probes do not ground the signal input to discharge electrostatic voltages on the device under test.

U.S. Pat. No. 6,734,689 describes a measurement probe providing signal control for an EOS/ESD protection control module. The measurement probe has a spring loaded coaxial probe assembly and a pressure sensor that work in combination to provide an activation signal to the control module. The spring loaded coaxial cable assembly and pressure sensor are disposed in a probe housing. The spring loaded coaxial probe assembly has a semi-rigid coaxial cable with one end forming a probing tip and the other end having a threaded connector. A flexible coaxial cable is connected to the threaded connector and to the control module. A compression spring is positioned over the semi-rigid coaxial cable with one end secured to the semi-rigid coaxial cable and the other end engaging the probe housing. The compression spring is pre-loaded to apply an initial force to the spring loaded coaxial probe assembly as shown graphically in FIG. 1. FIG. 1 shows the forces applied to the probing tip of the spring loaded coaxial probe assembly during use where "F" is the force applied to the probing tip, $k_1$ is the spring constant, and $\Delta X$ is the displacement of the spring from its equilibrium position. The pre-loading of the compression spring generates an initial force $F_1$ on the coaxial probe assembly. The pressure sensor has one electrical contact attached to the outer shielding conductor of the semi-rigid coaxial cable which is connected to electrical ground via the flexible coaxial cable. The other pressure sensor electrical contact is mounted to the probe housing. An electrical conductor electrically couples the pressure sensor to the control module.

The control modules provides a ground circuit path for the signal conductor of the measurement probe when the activation signal is absent. When the probing tip makes contact with the device under test, any static electricity on the DUT is coupled via the signal conductor to ground via the control module. As downward pressure is applied to probe housing, the coaxial probe assembly retracts into the probe body. The compression spring exerts increasing pressure on the coaxial probe assembly following Hook's Law of $F=K_1 \Delta X$ where $K_1$ is the spring constant. Continued downward pressure applied to the probe housing results in the pressure sensor contacts making contact. This results in the pressure sensor passing an activation signal which controls switching circuitry in the control module that removes a ground connection on the signal conductor of the measurement probe. Since the pressure sensor contacts are fixed to the semi-rigid coaxial cable and the probe housing, any continued downward pressure on the probe housing transfers the forces to the pressure sensor and the coaxial probe assembly as represented in FIG. 1 by the vertical force line. The excess forces on the pressure sensor and the coaxial probe assembly may result in damage to the pressure sensor or the coaxial probe assembly.

What is needed is a differential measurement probe having retractable double cushioned variable spacing probing tips and EOS/ESD protection capabilities. The variable tip spacing differential measurement probe needs to discharges static voltages on a device under test prior to the probing tips of the differential measurement probe being coupled to the signal channels of a sampling head. Further, the differential probe having retractable double cushioned variable spacing probing tips should provide an indication to a user that adequate pressure has been applies to the probe so as to prevent damage to the probe.

SUMMARY OF THE INVENTION

Accordingly, the present invention is a differential measurement probe having first and second coaxial probe assemblies with each coaxial probe assembly having a probing tip. The coaxial probe assemblies are received in a housing with the probing tips extending from one end of the housing. In the preferred embodiment, each of the first and second coaxial probe assemblies are formed of a semi-rigid coaxial cable having a probing tip at one end and a threaded connector at the other end. The probing tips end of the semi-rigid coaxial cables have curved portions that transitions to straight portions at the probing tips for angling the probing tips of the semi-rigid coaxial cables toward each other.

First compressible elements are disposed within the housing with one of the first compressible elements engaging the first coaxial probe assembly and applying a first pre-loaded compressive force to the first coaxial probe assembly and a first increasing compressive force by axial movement of the housing relative to the first coaxial probe assembly. The other first compressible element engages the second coaxial probe assembly and applies a first pre-loaded compressive force to the second coaxial probe assembly and a first increasing compressive force by axial movement of the housing relative to the second coaxial probe assembly. In the preferred embodiment, each of the first compressible elements is a compression spring positioned on one of the semi-rigid coaxial cables of each of the first and second coaxial probe assemblies. One end of the compression springs are fixedly positioned to the semi-rigid coaxial cables and the other ends engage the housing with the compression springs being compressed between the fixed positions on the semi-rigid coaxial cables and the housing to generate the first pre-loaded compressive forces.

Second compressible elements are disposed within the housing with one of the second compressible elements applying a second pre-loaded compressive force to the first coaxial probe assembly subsequent to the application of the first increasing compressive force on the first coaxial probe assembly and a second increasing compressive force by further axial movement of the housing relative to the first coaxial probe assembly. The other second compressible element applies a second pre-loaded compressive force to the second coaxial probe assembly subsequent to the application of the first increasing compressive force on the second coaxial probe assembly and a second increasing compressive force by further axial movement of the housing relative to the second and coaxial probe assembly.

First and second pressure sensors are disposed in the housing for passing an activation signal in response to the axial movement of the housing relative to the first and second coaxial probe assemblies. Each of the first and second pressure sensors has a first portion associated with each of the respective coaxial probe assemblies and a second portion associated with the housing. Each of the first and second pressure sensors has a first electrically conductive contact positioned on an outer shielding conductor the semi-rigid coaxial cables of each of the first and second coaxial probe assemblies and a second electrically conductive contact disposed in the housing. One of the first electrically conductive contacts is electrically coupled to the outer shielding conductor of one of the semi-rigid coaxial cables and the other first electrically conductive contact is electrically insulated from the outer shielding conductor of the other semi-rigid coaxial cable. The first and second pressure sensors produce a logical AND function when the first electrically conductive contacts of the first and second pressure sensors engage the second electrically conductive contacts of the first and second pressure sensors.

At least a first adjustment mechanism is disposed in the housing and mechanically coupled to one of the first and second coaxial probe assemblies for varying the probe tip spacing of the probing tips of the semi-rigid coaxial cables of the first and second coaxial probe assemblies.

The housing preferably has first and second members with at least one member having first and second channels formed therein. The first and second members are joined together to form an internal cavity for receiving the first and second coaxial probe assemblies, the first compressible elements, the second compressible elements and the first and second pressure sensors portions of at least the first adjustment mechanism.

In one embodiment of the differential measurement probe, each of the first electrically conductive contacts of the first and second pressure sensors has a retention block disposed adjacent to the probing tip of the semi-rigid coaxial cables of the first coaxial probe assembly. The retention block of the first pressure sensor has a curved slot disposed between opposing straight sections for receiving the curved portion of the semi-rigid coaxial cable of the first coaxial probe assembly with the first retention block functioning as the first electrically conductive contact of the first pressure sensor. The retention block of the second pressure sensor is disposed adjacent to the probing tip of the semi-rigid coaxial cables of the second coaxial probe assembly. The retention block of the second pressure sensor has a curved slot disposed between opposing straight sections for receiving the curved portion of the semi-rigid coaxial cable second coaxial probe assembly. A conductive member is disposed adjacent to and is electrically insulated from of a retention block of the second pressure sensor. Additionally, one of the second electrically conductive contacts of the first and second pressure sensors has a common electrically conductive contact for electrically coupling the second electrically conductive contacts together through one of the first electrically conductive contacts of the first and second pressure sensors. In this embodiment, each of the second compressible elements is a compression spring disposed within a bore of an electrically conductive housing having a movable electrical contact secured within the bore. The compression springs of the second compressible elements are compressed between the electrically conductive housings and the movable electrical contacts to generate the second pre-loaded compressive forces. Each of the electrically conductive housings and the movable electrical contacts form one of the second electrically conductive contacts of the first and second pressure sensors.

The adjustment mechanism has a carrier that includes a threaded aperture therein. The carrier receives one of the first and second retention blocks disposed adjacent to the probing tips of the semi-rigid coaxial cables of the first and second coaxial probe assemblies. A threaded screw having a screw head attached to a threaded shank engages the threaded aperture in the carrier. The screw head is received and captured in a recess in the exterior surface of the housing and the threaded shank passes through an aperture in the housing for engaging the carrier. In the preferred embodiment, the carrier has a "U" shaped member that has a base and sidewalls with the retention block being closely received in the "U" shaped member. By turning the threaded screw in the adjustment member, at least one of the probing tips of the first and second coaxial probe assemblies moves in relation to the other probing tip to vary the spacing between the probing tips.

In the preferred embodiment, each of the first and second coaxial probe assemblies further have an attachment plate disposed on the semi-rigid coaxial cable adjacent to the threaded connector. Each attachment plate is secured to an anti-rotation block which is positioned within the housing. A bracket having a top plate and depending sidewalls is secured to one of the attachment plates. At least a first electrical connector receptacle is mounted on the bracket and is electrically coupled one of the first and second pressure sensors by and electrical conductor.

A differential measurement probe is preferably coupled via first and second coaxial cables to at least a first electrical over stress and electrostatic discharge protection control module. The differential measurement probe passes the activation signal to the electrical over stress and electrostatic discharge protection control module for electrically coupling the probing tips of the differential measurement probe to input circuitry of the measurement test instrument. One of the second electrically conductive contacts of the first and second pressure sensors is coupled to the electrical over stress and electrostatic discharge protection control module via the electrical conductor. The probing tips of the first and second coaxial probe assemblies are coupled to electrical ground via the electrical over stress and electrostatic discharge protection control module prior to the first electrically conductive contacts of the first and second pressure sensors engaging the second electrically conductive contacts of the first and second pressure sensors. The probing tips of the first and second coaxial probe assemblies are coupled to the input circuitry of the measurement test instrument when the electrical over stress and electrostatic discharge protection control module receives the activation signal passed by the first and second pressure sensors in response to the first electrically conductive contacts of the first and second pressure sensors engaging the second electrically conductive contacts of the first and second pressure sensors.

The electrical conductor coupling one of the second electrically conductive contacts of the first and second pressure sensors to the electrical over stress and electrostatic discharge protection control module preferably has first and second insulated wire segments. The first insulated wire segment electrically couples one of the second electrically conductive contacts of the first and second pressure sensors to an electrical contact of the electrical connector receptacle mounted on the differential measurement probe. The second insulated wire segment electrically couples an electrical contact of a first electrical plug to an electrical contact of a second electrical plug with the first electrical plug mating with the electrical connector receptacle mounted on the differential measurement probe and the second electrical plug mating with an electrical connector receptacle having a first electrical contact mounted in the electrical over stress and electrostatic discharge protection control module.

The differential measurement probe may also be connected to first and second electrical over stress and electrostatic discharge protection control modules. In this embodiment, the first coaxial cable of the differential measurement probe is coupled to the first electrical over stress and electrostatic discharge protection control module and the second coaxial cable is coupled to the second electrical over stress and electrostatic discharge protection control module. The differential measurement probe passing the activation signal to both of the electrical over stress and electrostatic discharge protection control modules. The electrical conductor then consists of a first insulated wire segment electrically coupling one of the second electrically conductive contacts of the first and second pressure sensors to respective electrical contacts of first and second electrical connector receptacles mounted on the differential measurement probe. Second and third insulated wire segments electrically couple the activation signal to the first and second electrical over stress and electrostatic discharge protection control modules. Each second and third insulated wire segment has first and second electrical plugs with each first and second electrical plug having an electrical contact. The electrical contact of the first electrical plug of the second insulated wire mates with the electrical contact of the first electrical connector receptacle mounted on the differential measurement probe and the electrical contact of the second electrical plug of the second insulating wire mates with an electrical contact of an electrical connector receptacle mounted in the first electrical over stress and electrostatic discharge protection control module. The electrical contact of the first electrical plug of the third insulated wire mates with the electrical contact of the second electrical connector receptacle mounted on the differential measurement probe and the electrical contact of the second electrical plug of the third insulating wire mates with an electrical contact of an electrical connector receptacle mounted in the second electrical over stress and electrostatic discharge protection control module.

The objects, advantages and novel features of the present invention are apparent from the following detailed description when read in conjunction with appended claims and attached drawings.

DETAILED DESCRIPTION OF THE PREFERRED EMBODIMENT

Figure 1:
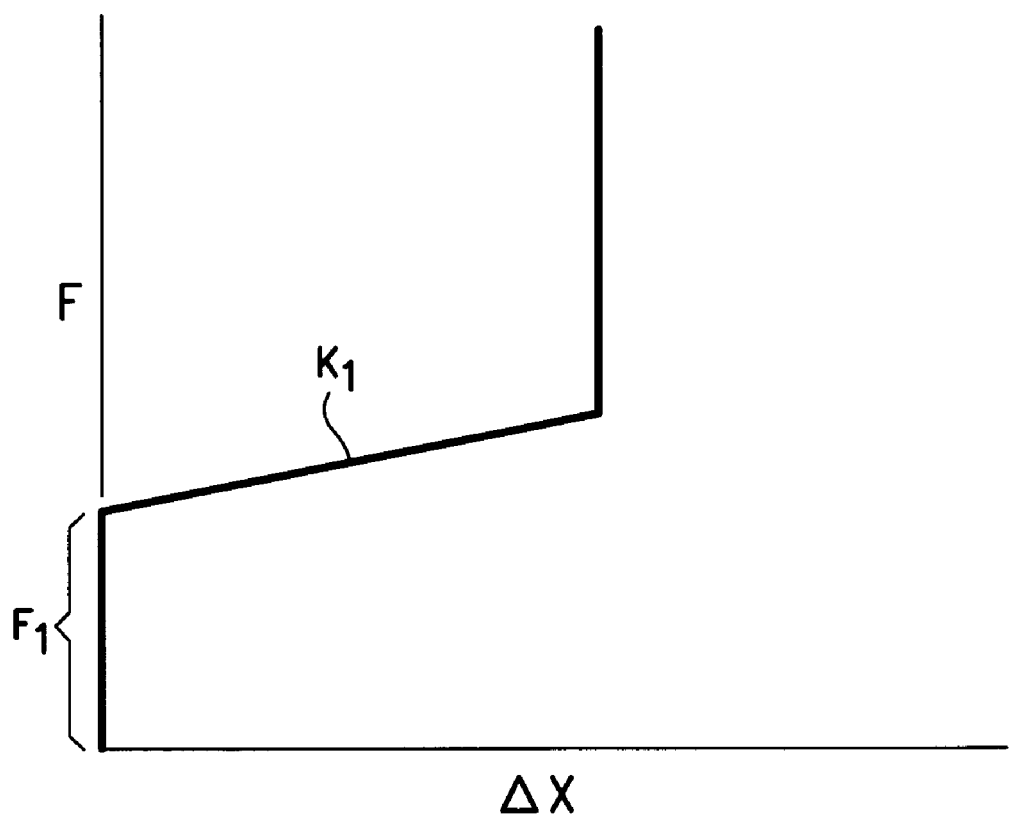
FIG. 1 is a graphical representation of the forces applied to a probing tip of representative existing probe assemblies.
Figure 2:
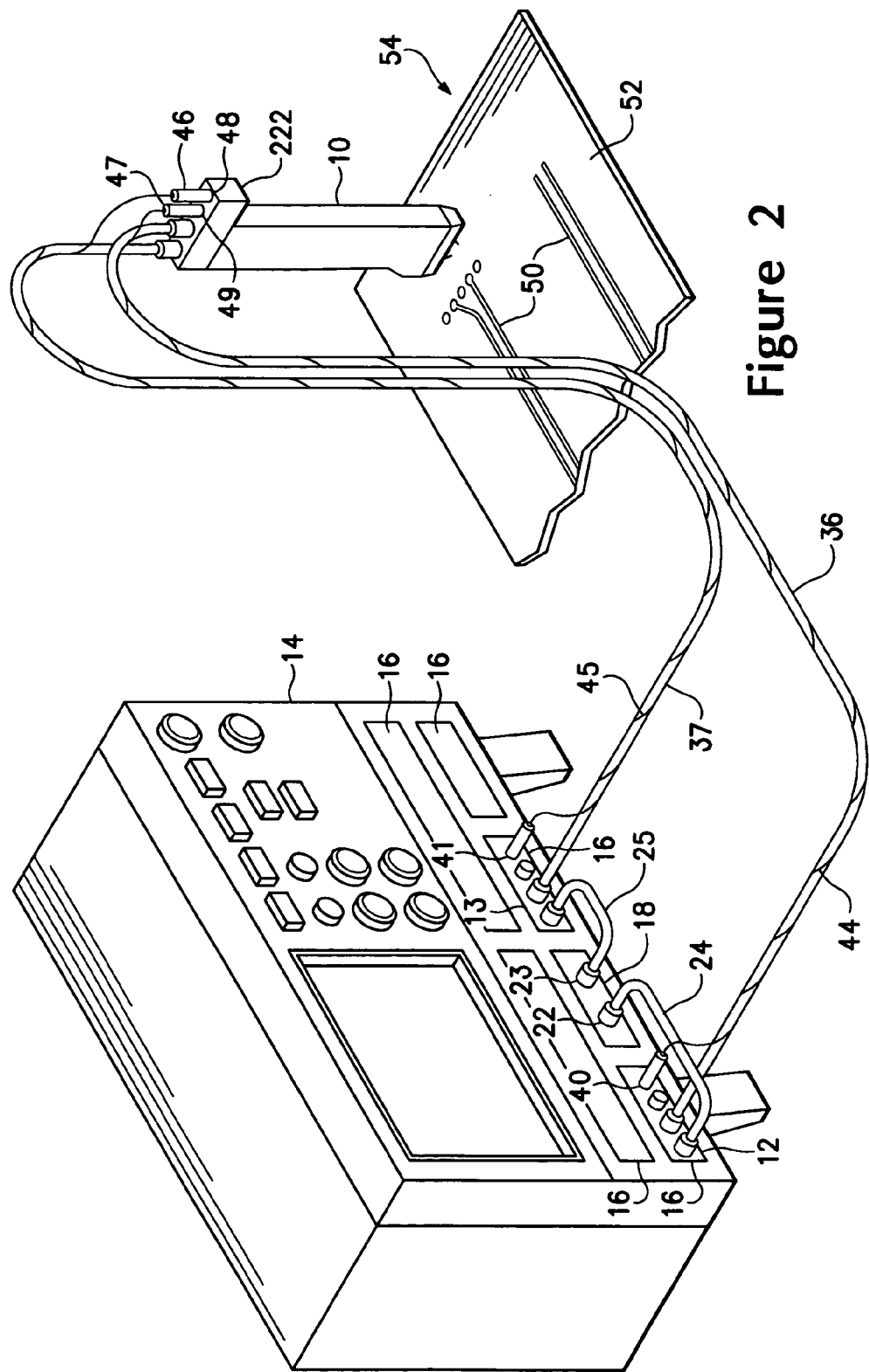
FIG. 2 is a perspective view of a differential measurement probe having retractable double cushioned variable spacing probing tips for passing an activation signal to an EOS/ESD protection control module according to the present invention.

Referring to FIG. 2, there is shown a representative view of a differential measurement probe 10 having retractable double cushioned variable spacing probing tips for passing an activation signal to first and second electrical over stress (EOS) and electrostatic discharge (ESD) protection control modules 12, 13. The control modules 12, 13 are disposed in a measurement test instrument 14, preferably a sampling oscilloscope, such as the TDS82000 Digital Sampling Oscilloscope, manufactured and sold by Tektronix, Inc., Beaverton, Oreg. The digital sampling oscilloscope 14 has a modular architecture that includes multiple bays 16 for receiving various types of optical and electrical plug-in modules 18. The bays 16 provide power, control signals and signal output for the modules. One such module is the 80E04 Dual Channel TDR Sampling Head that is usable for making TDR measurements. The sampling head 18 has input terminals 22, 23 coupled to first and second channel sampling diodes which are terminated in 50 ohms with low parasitic capacitance. The input terminals 22, 23 are coupled via coaxial cables 24, 25 to the respective control modules 12, 13 inserted into bays 16 of the oscilloscope 14.

Figure 3:
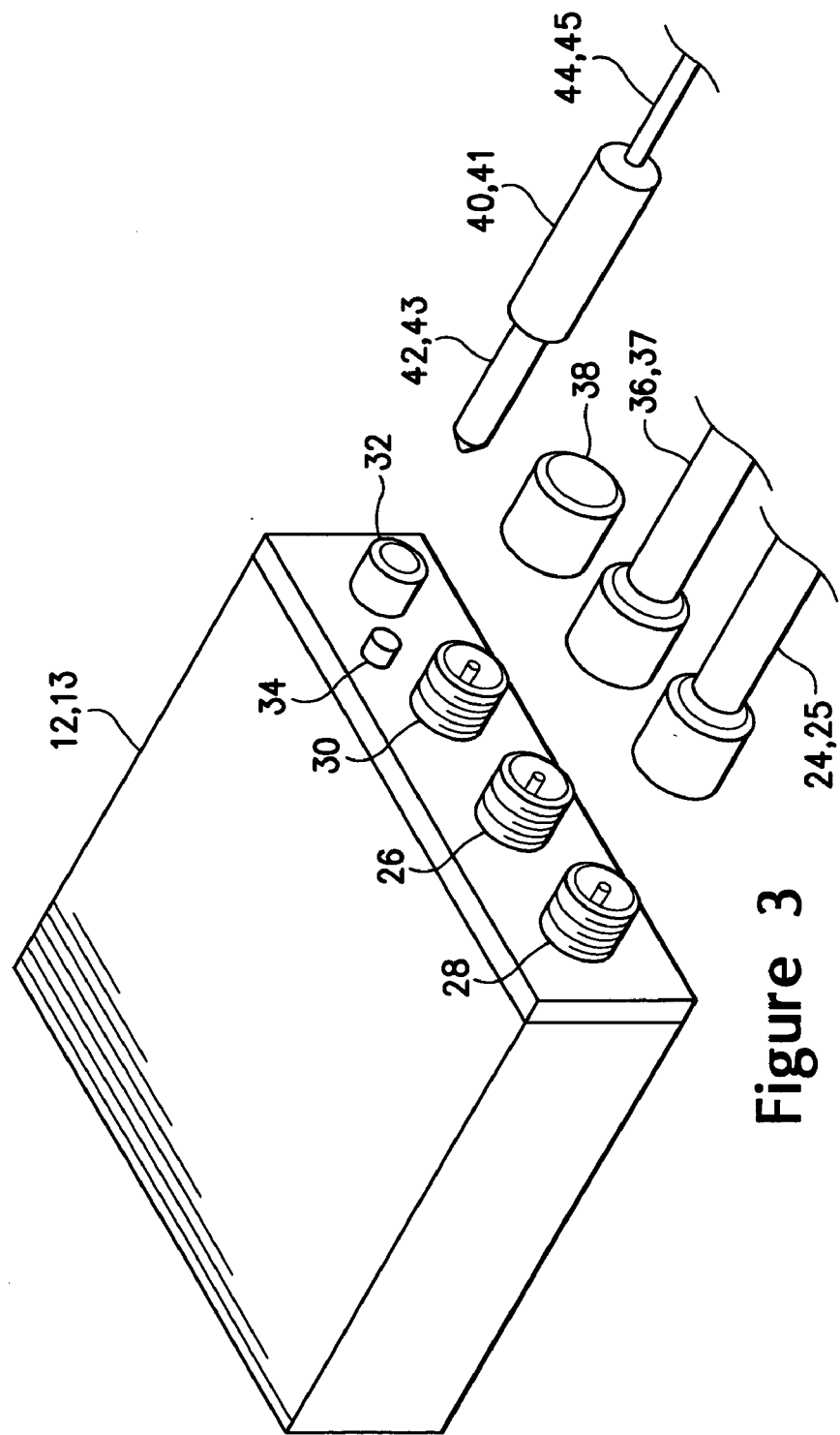
FIG. 3 is a perspective view of a first EOS/ESD protection control module coupled to the differential measurement probe having retractable double cushioned variable spacing probing tips for passing an activation signal according to the present invention.

The respective control modules 12, 13 are best shown in the perspective view of FIG. 3. Each control module 12, 13 has a coaxial input terminal 26, a coaxial output terminal 28, and a coaxial termination terminal 30. An electrically conductive input connector 32 is also provided in the control modules 12, 13. An optional visual indicator 34, such as an LED may be secured to the control modules 12, 13 to indicate when one of the respective probing tips of the variable tip spacing differential measurement probe 10 are coupled to the sampling head 18. The coaxial input terminals 26 of the control modules 12, 13 are coupled to one end of respective coaxial cables 36, 37 whose other ends are coupled to the variable tip spacing differential measurement probe 10. The coaxial output terminals 28 are coupled by respective coaxial cables 24, 25 to the input terminals 22, 23 of the sampling head 18. A 50 ohm termination connector 38 is secured to the coaxial termination terminal 30. Respective electrically conductive plug connectors 40, 41 plug into the input connector 32. The electrical contacts 42, 43 of the plug connectors 40, 41 are electrically connected to electrical conductors 44, 45 having second plug connectors 46, 47 at the other end. The second plug connectors 46, 47 are plugged into plug receptacles 48, 49 mounted on the variable tip spacing differential measurement probe 10. The variable tip spacing differential measurement probe 10 is used to probe circuit traces 50 and devices mounted on a circuit board 52 of a device under test 54. The circuit board 52 illustrates two sets of circuit traces 50 with one set of traces configured in the tradition G-S-G-S-G contacts with the traces 50 flaring out to the contacts. The other set of traces 50 is not configured with the tradition contact configuration. The differential measurement probe 10 having retractable double cushioned variable spacing probing tips has the capability to probe both sets of traces 50 by varying the spacing of the probing tips.

Figure 4:
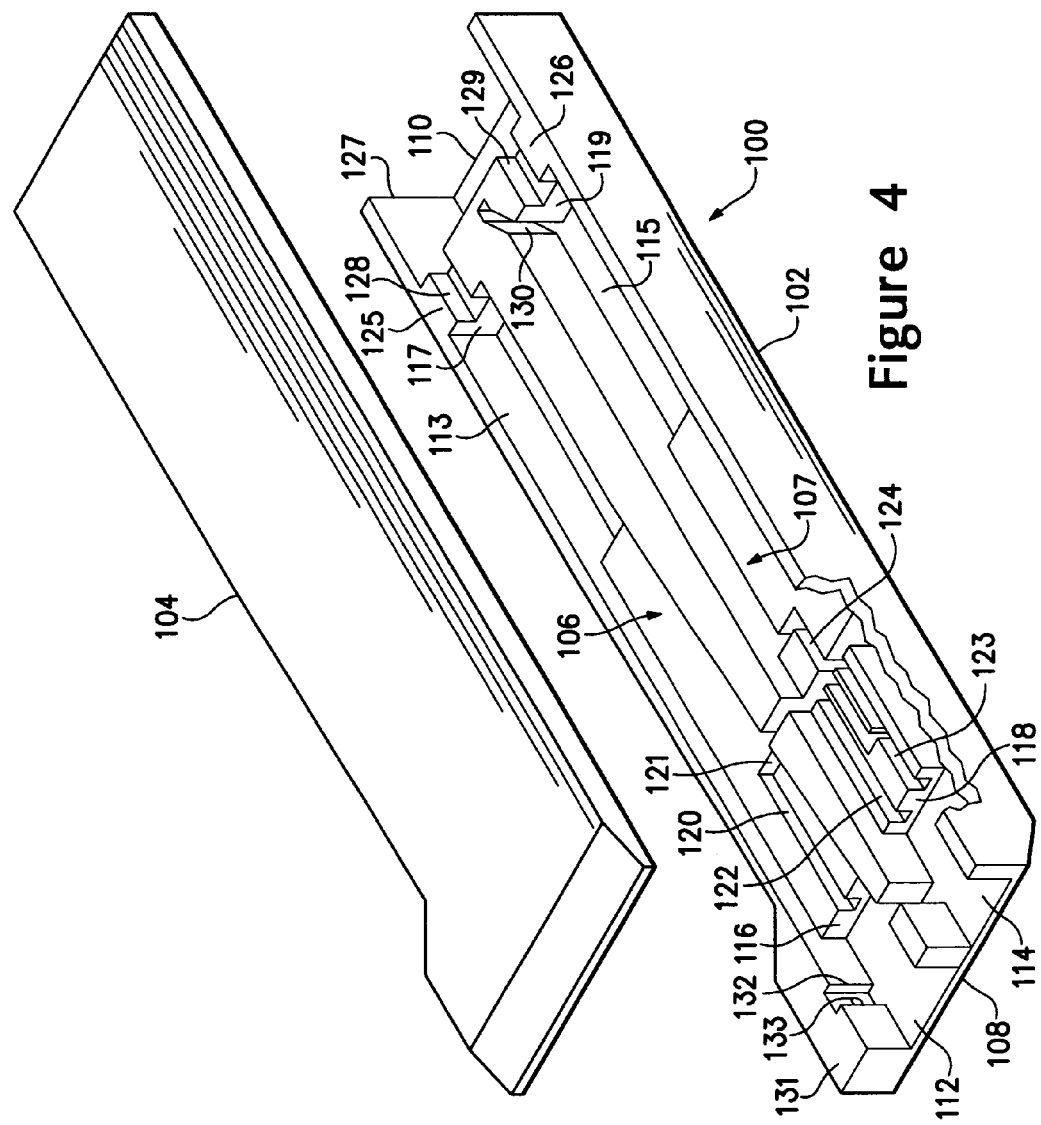
FIG. 4 is a exploded perspective view of the housing for the differential measurement probe having retractable double cushioned variable spacing probing tips for passing an activation signal to an EOS/ESD protection control module according to the present invention.

Referring to FIG. 4, there is shown a exploded view of a housing 100 for a first embodiment of the differential measurement probe 10 having retractable double cushioned variable spacing probing tips with the capability for passing an activation signal to EOS/ESD protection control modules 12, 13. The housing 100 is preferably elongate with a predominate rectangular cross-section and made of first and second member 102, 104. The housing 100 is formed of an insulating material, such as ABS plastic, polycarbonate, or the like. At least one of the housing members 102 has first and second channels 106, 107 that are exposed at the front end 108 of the housing member 102. Preferably the channels 106, 107 are formed parallel to each other and parallel to the longitudinal axis of the housing member 102. Each channel, 106, 107 has respective recesses 112, 113 and 114, 115 formed therein. Each recess 112, 113, 114 and 115 has a rear end wall 116, 117, 118 and 119. A slot 120 is formed in the channel 106 extending from the rear end wall 116 of the recess 112 to a cross channel slot 121 formed in the housing member 102 between the channels 106, 107. Two parallel slots 122, 123 are formed in the channel 107 with the one slot 122 intersecting the cross channel slot 121. A longitudinal slot 124 is formed in the channel 107 extending from the slot 123 to the recess 115 in the channel 107. The rear end walls 119 and 119 are surfaces of channel partitions 125, 126 that separate the channels 106, 107 from a rearward facing open recess 127 at the back end 110 of the housing member 102. Each channel partition 125, 126 has a notch 128, 129 formed in the top. A slot 130 is formed in the channel partition 126 that intersects with the recess 115. An bore (not shown) is formed in the slot 130 that extends to the exterior surface of the housing member 102. A substantially solid protrusion 131 extends outward from one side of the housing member 102. A recess 132 is formed in the protrusion wall that intersects the recess 112 in the channel 106. A bore 133 is formed in the protrusion 131 that extends from the recess 132 to the exterior side surface of the housing member 102. The channels 106, 107 and recesses 112, 113, 114 and 115 form an interior cavity 134 within the housing 100 when the first and second housing members 102 and 104 are attached to each other. While the above housing 100 has been described with a channels 106, 107 and recesses 112, 113, 114, 115 and 127 formed in one housing member 102, the housing 100 may be formed with channels and recesses in both housing members 102, 104 that form the interior cavity 134 and recess 127 when the housing members 102, 104 are attached to each other.

Figure 5:
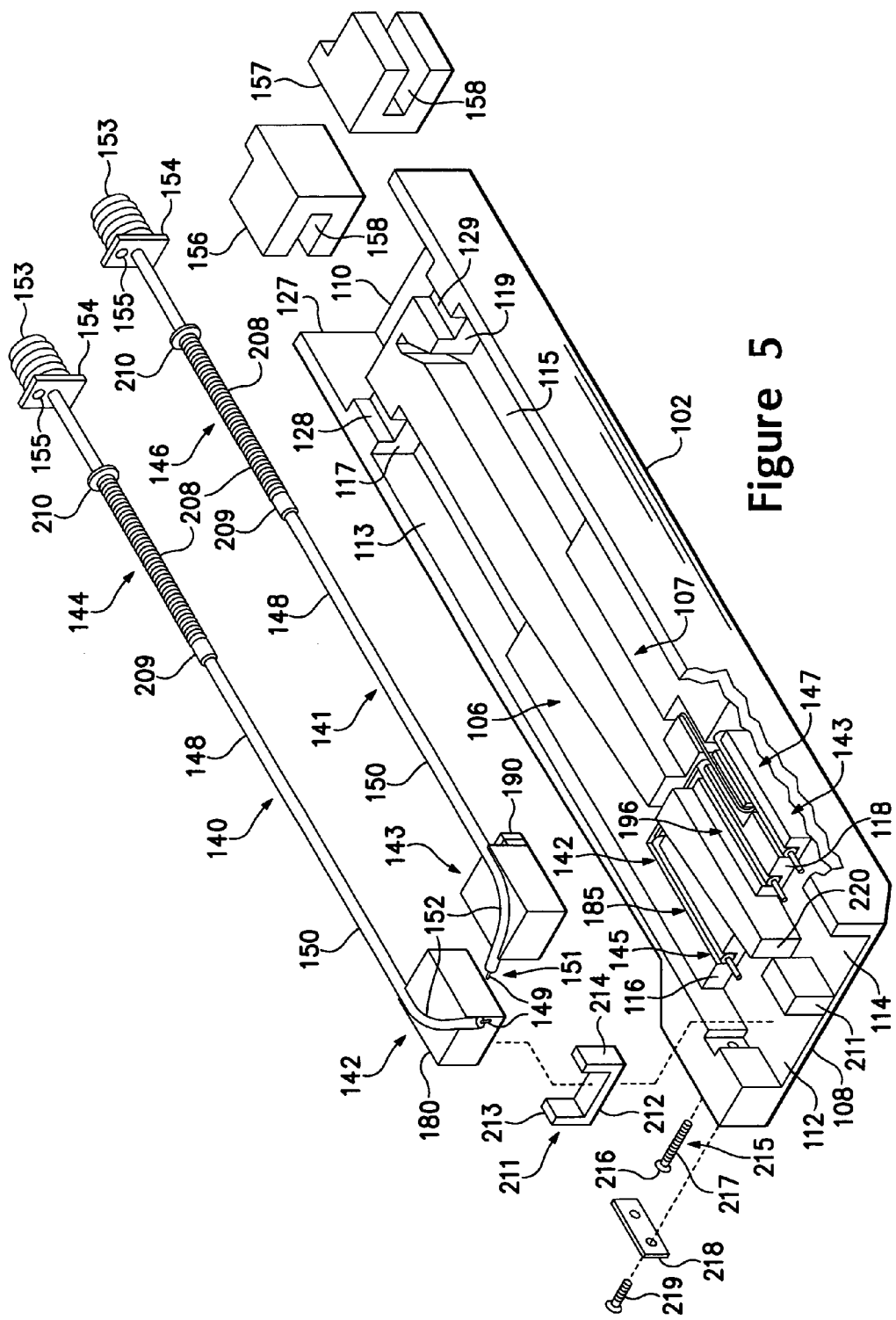
FIG. 5 is a partially exploded view of a first embodiment of the differential measurement probe having retractable double cushioned variable spacing probing tips for passing an activation signal to an EOS/ESD protection control module according to the present invention.

Referring to FIG. 5, there is shown a partial exploded view of first and second coaxial probe assemblies 140, 141, first and second pressure sensors 142, 143, first and second compressive elements 144, 145 of the first coaxial probe assembly 140, and first and second compressive elements 146, 147 of the second coaxial probe assembly 141 Each of the coaxial probe assemblies 140, 141 has a semi-rigid coaxial cable 148 having a central signal conductor 149 and an outer shielding conductor 150. The central signal conductor 149 extends outward past the outer shielding conductor 150 at one end to form a probing tip 151. The semi-rigid coaxial cable 148 has a curved portion 152 at the probing tip end 151 that transitions to straight portions at the probing tip 151 and extending toward coaxial threaded connector 153 attached to the other end of the semi-rigid coaxial cable 148. The threaded portion of the coaxial threaded connector 153 is coupled to the outer shielding conductor 150 and the central signal conductor 149 is coupled to a central conductor axially disposed within the coaxial threaded connector 153. An attachment plate 154 is attached to the outer shielding conductor 150 adjacent to the coaxial threaded connector 153. The attachment plate 154 is preferably rectangular in shape and had apertures 155 therein for receiving threaded screws. Abutting each attachment plate 154 on the side away from the coaxial threaded connector 153 is an anti-rotation block 156, 157. Each anti-rotation block 156, 157 has a channel 158 formed therein that accepts the semi-rigid coaxial cable 148. The anti-rotation blocks 156, 157 have threaded apertures that receive the threaded screws passing through the apertures 155 of the attachment plates 154 for securing the anti-rotation blocks 156, 157 to the attachment plates 154.

Figure 6:
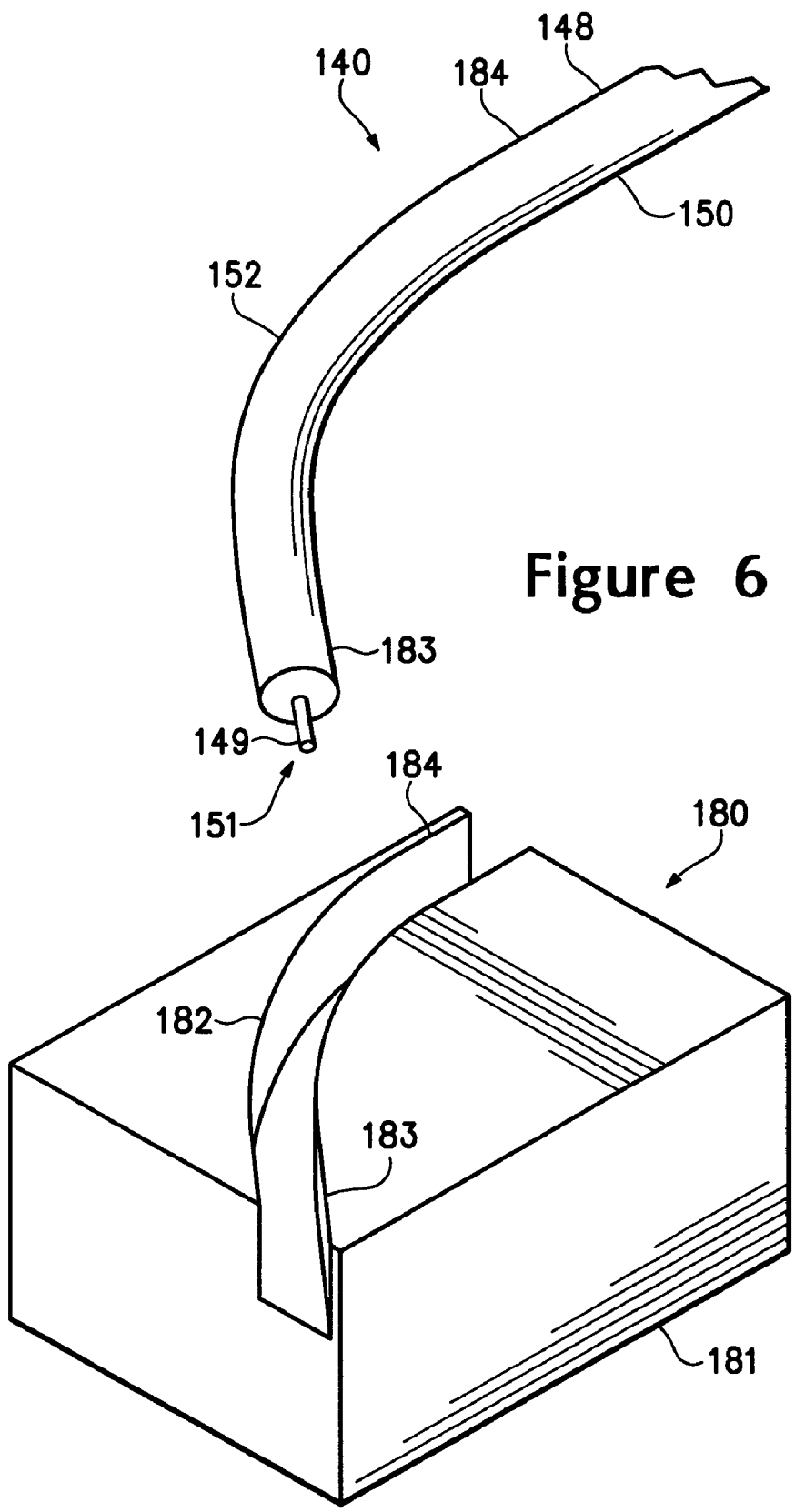
FIG. 6 is a perspective view of a first retention block and the curved portion of the semi-rigid coaxial cable in the measurement probe having retractable double cushioned variable spacing probing tips for passing an activation signal to an EOS/ESD protection control module according to the present invention.
Figure 7:
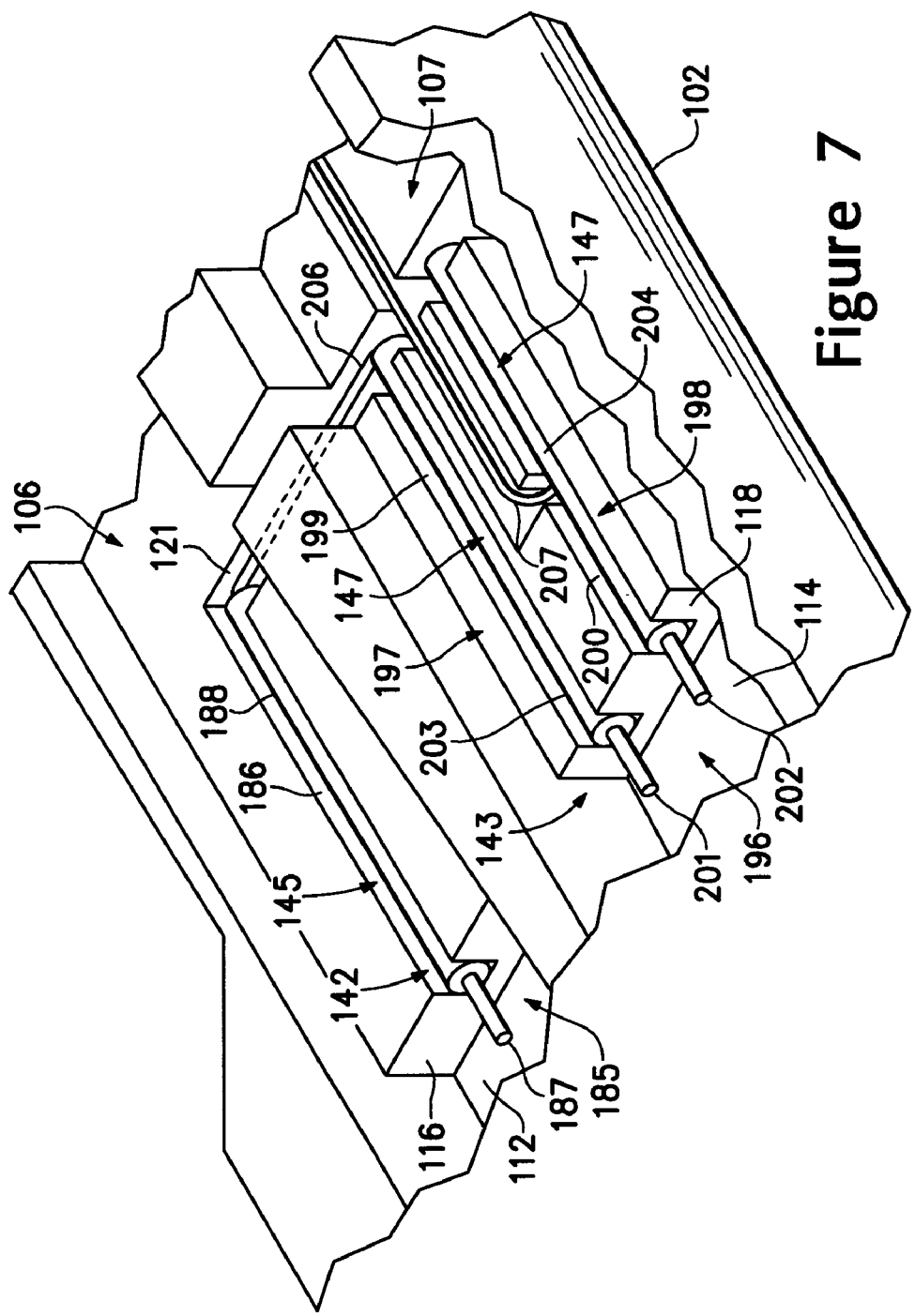
FIG. 7 is a close-up perspective view of the second electrically conductive contacts of the first and second pressure sensors and the second compressive elements of the differential measurement probe having retractable double cushioned variable spacing probing tips for passing an activation signal to an EOS/ESD protection control module according to the present invention.

The first pressure sensor 142 has a first electrically conductive contact 180 positioned on the semi-rigid coaxial cable 148. The electrically conductive contact 180 preferably takes the form of a rectangular shaped retention block 181 having a curved slot 182 as best shown in FIG. 6. The curved portion 152 of the semi-rigid coaxial cable 148 of the first coaxial probe assembly 140 is disposed in the curves slot 182 of the retention block 181. The curved portion 152 of the semi-rigid coaxial cable 148 and the recessed curved slot 182 have a preferred center line radius of 1.1 inches and a total radius of curvature ranging from 10 to 45 degrees with the preferred radius of curvature of 22 degrees. The ends of the curved slot 182 in the retention block 181 and curved portion 152 of the semi-rigid coaxial cable 148 transition to straight portions 183 and 184 with the probing tip end 151 and the shaft portion of the semi-rigid coaxial cable 148 extend tangential to the curved portion 152 of the semi-rigid coaxial cable 148. The curved and straight portions 152, 183, 184 of the semi-rigid coaxial cable 152 are positioned in the curved slot 182 of the retention block 181. The semi-rigid coaxial cable 148 has the tendency to spring back to some degree when bent into a curved shape. This property is used to secure the semi-rigid coaxial cable 148 in the curve slot 182 of the retention block 181 and make electrical contact between the outer shielding conductor 150 of the semi-rigid coaxial cable 148 and the retention block 181. The curved and straight portions 152, 183, 184 of the outer shielding conductor 150 of the semi-rigid coaxial cable 148 presses against the side of the curved slot 182 to secure the semi-rigid coaxial cable 148 in the retention block 181. The retention block 181 of the first electrically conductive contact 180 is preferably made of an electrically conductive material, such as copper, brass, or the like, that is plated with gold. The height of the retention block 181 generally conforms to the height of the recess 112 formed in the housing member 102 and a width sufficient to make contact with a second electrically conductive contact 185 of the first pressure sensor 142. The second electrically conductive contact 185 of the first pressure sensor 142 is disposed within a slot 186 formed in the housing member 102 as best seen in the perspective view of FIG. 7. The slot 186 is aligned parallel with the channel 106 in the housing member 102. The second electrically conductive contact 185 of the first pressure sensor 142 has a movable electrical contact 187 that is disposed within a bore of an electrically conductive housing 188. The second compressive element 145 of the first coaxial probe assembly 140 is also disposed within the bore of the electrically conductive housing 188. The movable electrical contact 187 extends into the recess 112 for making electrical contact with the first electrically conductive contact 180 of the first pressure sensor 142.

Figure 8:
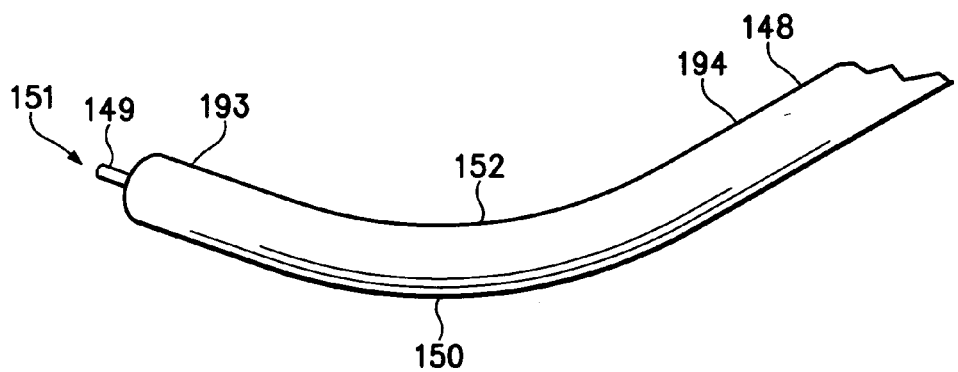
FIG. 8 is a perspective view of a second retention block and the curved portion of the semi-rigid coaxial cable in the measurement probe having retractable double cushioned variable spacing probing tips for passing an activation signal to an EOS/ESD protection control module according to the present invention.
Figure 8:
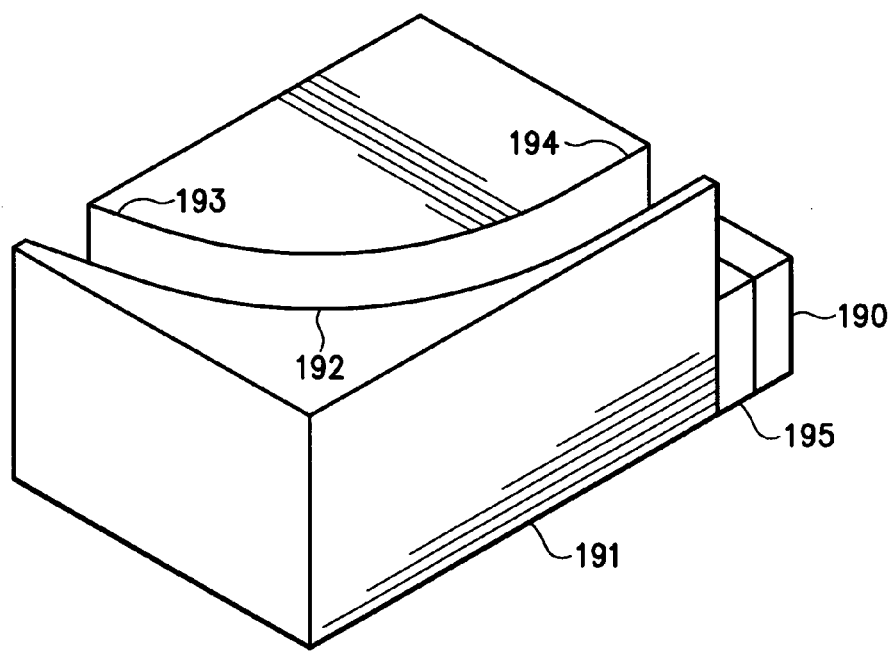

The second pressure sensor 143 has a first electrically conductive contact 190 positioned on a rectangular shaped retention block 191 having a curved slot 192 as best shown in FIG. 8. The curved portion 152 of the semi-rigid coaxial cable 148 of the second coaxial probe assembly 141 is disposed in the curves slot 192 of the retention block 191. The curved portion 152 of the semi-rigid coaxial cable 148 and the recessed curved slot 192 have a preferred center line radius of 1.1 inches and a total radius of curvature ranging from 10 to 45 degrees with the preferred radius of curvature of 22 degrees. The ends of the curved slot 192 in the retention block 191 and curved portion 152 of the semi-rigid coaxial cable 148 transition to straight portions 193 and 194 with the probing tip end 151 and the shaft portion of the semi-rigid coaxial cable 148 extend tangential to the curved portion 152 of the semi-rigid coaxial cable 148. The curved and straight portions 152, 193, 194 of the semi-rigid coaxial cable 148 are positioned in the curved slot 192 of the retention block 191. The semi-rigid coaxial cable 148 has the tendency to spring back to some degree when bent into a curved shape. This property is used to secure the semi-rigid coaxial cable 148 in the curve slot 192 of the retention block 191 and make electrical contact between the outer shielding conductor 150 of the semi-rigid coaxial cable 148 and the retention block 191. The curved and straight portions 152, 193, 194 of the outer shielding conductor 150 of the semi-rigid coaxial cable 148 presses against the side of the curved slot 192 to secure the semi-rigid coaxial cable 148 in the retention block 191. The rectangular shaped retention block 191 is formed of a hard material, such as brass, aluminum or the like for providing a solid backing surface for the electrically conductive contact 190. An electrically insulating material 195 is disposed between the electrically conductive contact 190 and the retention block 191 to electrically isolate the contact 190 from the coaxial probe assembly 141. The first electrically conductive contact 190 is preferably made of an electrically conductive material, such as copper, brass, or the like, that is plated with gold. The height of the block 191 generally conforms to the height of the recess 112 formed in the housing member 102 and a width sufficient so that the first electrically conductive contact 190 makes contact with a second electrically conductive contact 196 of the second pressure sensor 143. The second electrically conductive contact 196 of the second pressure sensor 143 consists of two electrically conductive elements 197, 198 that are disposed within slots 199 and 200 formed in the housing member 102. The slots 199, 200 are aligned parallel with the channel 107 in the housing member 102. The electrically conductive elements 197, 198 of the second electrically conductive contact 196 of the second pressure sensor 143 have first and second movable electrical contacts 201, 202 that are disposed within bores of respective electrically conductive housings 203, 204. The second compressive element 147 of the second coaxial probe assembly 141 is also disposed within the bores of the electrically conductive housings 203, 204. The movable electrical contacts 201, 202 extend into the recess 114 for making electrical contact with the first electrically conductive contact 190 of the second pressure sensor 143. An insulated wire 206 is disposed in the cross channel slot 121 that electrically couples the electrically conductive housing 188 of the second electrical contact 185 of the first pressure sensor 142 to the electrically conductive housing 203 of the electrically conductive element 197 of the second electrically conductive contact 196. The insulated wire 206 and the electrically conductive element 197 form a common electrical element for coupling the activation signal between the second electrically conductive contacts 185, 196 of the first and second pressure sensors 142, 143 through the first electrically conductive contacts 180, 190. An insulated wire 207 electrically couples the electrically conductive housing 204 of the electrically conductive element 198 to the plug receptacles 48, 49 mounted on the differential measurement probe 10. Alternately, the insulated wire 206 may also be coupled to the electrically conductive housing 188 of the first electrically conductive contact 180 of the first pressure sensor 142 if the first electrically conductive contact 180 of the first pressure sensor 142 is electrically insulated from the semi-rigid coaxial cable 148 of the first coaxial probe assembly 140 and the first electrically conductive contact 190 of the second pressure sensor 143 is electrically coupled to the semi-rigid coaxial cable 148 of the second coaxial probe assembly 141. In the preferred embodiment, the second electrically conductive contact 185 of the first pressure sensor 142 and the electrically conductive elements 197, 198 of the second electrical contact 196 of the second pressure sensor 143 are pogo pins.

Returning to FIG. 5, each of the first compressive elements 144, 146 of the first and second coaxial probe assemblies 140, 141 is a compression spring 208 that is positioned on the semi-rigid coaxial cables 148 of the coaxial probe assemblies 140, 141. One end of the compression springs 208 are preferably held in place on the semi-rigid coaxial cables 148 by a compression spring retention members 209 secured to outer shielding conductors 150 of the semi-rigid coaxial cables 148. Each of the compression spring retention members 209 is preferably a collar that fits over the semi-rigid coaxial cables 148. The collars are formed of a solid material, such as metal, ABS plastic, or the like. The collars are placed on the semi-rigid coaxial cables 148 and secured to the semi-rigid coaxial cables 148 with an adhesive, such as epoxy, Locktite® or the like. The other ends of the compression springs 208 are free to move along the semi-rigid coaxial cables 148. A pressure plate 210 in the form of a washer is preferably positioned adjacent to each of the free ends of the compression springs 208 for engaging the rearward end walls 117, 119 of the recesses 113, 115 of the channels 106, 107.

The second compressive elements 145, 147 are compression springs disposed within the bores of an electrically conductive housings 188, 203, 204 and captured between the closed ends of the bores and the movable electrical contacts 187, 201, 202. The compression springs are partially compressed in the electrically conductive housings 188, 203, 204 by the movable electrical contacts 187, 201, 202. The partially compressed spring in the electrically conductive housing 188 generates a pre-loaded compressive force $F_2$ on the movable electrical contact 187 as graphically shown in FIG. 9A. An increasing axial force is required on the movable electrical contact 187 to move the electrical contact 187 into the electrically conductive housing 188 as represented by the sloping line $K_2$. The force applied to the movable electrical contact follows Hook's law of $F=K_2\Delta X$ where $K_2$ is the spring constant and $\Delta X$ is the displacement of the spring from its initial equilibrium position. Each of the partially compressed springs in the electrically conductive housings 203, 204 generates a pre-loaded compressive force $F_3$ on the movable electrical contacts 201, 202 as graphically shown in FIG. 9A. An increasing axial force is required on the each of the movable electrical contacts 201, 202 to move the electrical contacts 201, 202 into the electrically conductive housings 203, 204 as represented by the sloping line $K_3$. The pre-loaded compressive forces and the increasing axial forces on the movable electrical contacts 201, 202 exerted by the compression springs in the electrically conductive housings 203, 204 are additive so that the total pre-loaded compressive force and increasing axial force exerted by the second compressive element 147 on the second coaxial probe assembly 141 is substantially equal to the pre-loaded compressive force and increasing axial force exerted by the second compressive element 145 on the first coaxial probe assembly 140.

Figure 9A:
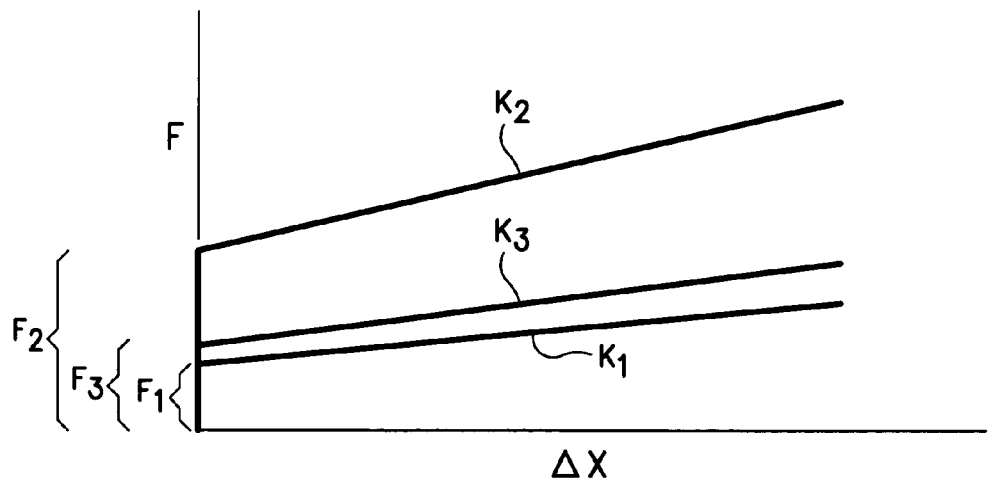
FIG. 9A is a graphical representation of the individual forces applied by the first and second compressive elements to the coaxial probe assemblies in the differential measurement probe having retractable double cushioned variable spacing probing tips for passing an activation signal to an EOS/ESD protection control module according to the present invention.

The coaxial probe assemblies 140, 141 are positioned in the housing member 102 with the probing tips 151 extending out from the end 108 of the housing member 102 and the coaxial threaded connectors 153 extending out from the other end 110 of the housing member 102. The compression springs 208 of the first compression elements 144, 146 are position in the respective recesses 113, 115 of the first and second channels 106, 107 with the compression springs 208 being compressed and abutted against the rearward end walls 117, 119 of the recesses 113, 115. The first electrically conductive contact 180 of the first pressure sensor 142 and the first electrically conductive contact 190 of the second pressure sensor 143 are positioned in the respective recesses 112, 114. The anti-rotation blocks 156, 157 attached to the coaxial probe assemblies 140, 141 are positioned in the recess 127. The initial compression of the compression springs 208 applies a pre-loaded compressive force $F_1$ on each of the coaxial probe assemblies 140, 141 as represented in the graph of FIG. 9A. An increasing force is required to displace the free ends of the compression springs 208 as represented by the sloping line $K_1$ where $K_1$ is the spring constant of the compression springs 208 and follows Hook's law of $F=K_1\Delta X$ where $\Delta x$ is the displacement of the spring from its initial equilibrium position.

Figure 9B:
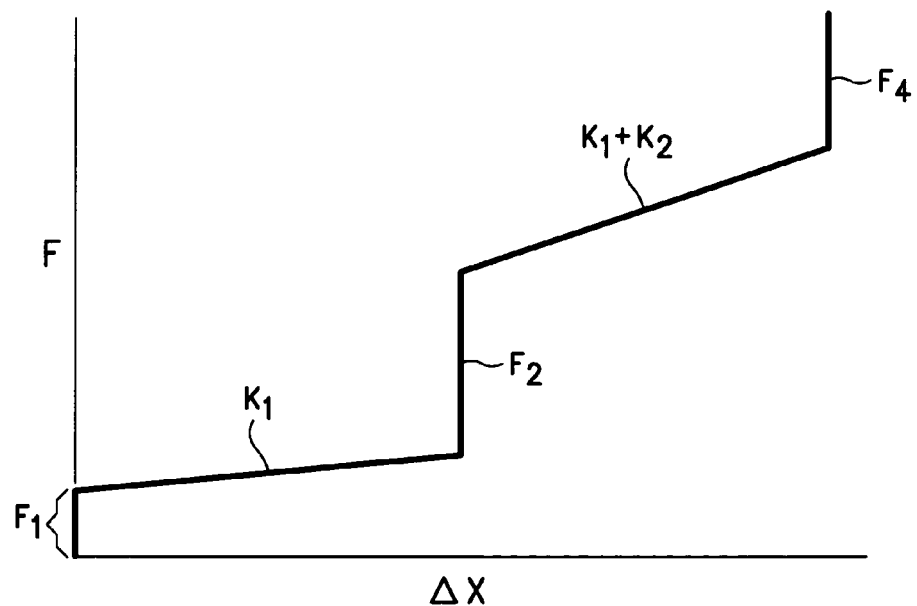
FIG. 9B is a graphical representation of the combined forces applied by the first and second compressive elements to the coaxial probe assemblies in the differential measurement probe having retractable double cushioned variable spacing probing tips for passing an activation signal to an EOS/ESD protection control module according to the present invention.

The coaxial probe assemblies 140, 141 have an initial force applied to them by the pre-loaded compressive forces of compression springs 208 as represented by the force $F_1$ in FIG. 9B. With the probing tips 151 positioned on the device under test 54, downward movement of the probe housing 100 relative to the coaxial probe assemblies 140, 141 causes the rearward end walls 117, 119 of the recesses 117, 119 to compress the compression springs 208 as represented by the sloping line $K_1$. The force applied to the coaxial probe assemblies 140, 141 and correspondingly to the probing tips 151 is the combination of the pre-loaded compressive force $F_1$ plus the increasing force required by the spring constant $K_1$ of the compression springs 208.

The downward movement of the probe housing 100 causes the second electrically conductive contact 185 of the first pressure sensor 142 to move toward the first electrically conductive contact 180 of the first pressure sensor 142. Likewise, the downward movement of the probe housing 100 causes the movable electrical contacts 201, 202 of the second electrically conductive contact 196 of the second pressure sensor 143 to move toward the first electrically conductive contact 190 of the second pressure sensor 143. When the first and second electrically conductive contacts 180, 185 of the first pressure sensor 142 are brought into contact, an activation signal is passed to the electrically conductive element 197 of the second electrically conductive contact 196 of the second pressure sensor 143. When the first electrically conductive contact 190 of the second pressure sensor 143 is brought into contact with the movable electrical contacts 201, 202 of the electrically conductive elements 197, 198 of the second electrically conductive contact 196 of the second pressure 143, the activation signal is passed through the second pressure sensor 143 to the plug receptacles 48, 49 via the insulated wire 207. The activation signal is then coupled to the control modules 12, 13 via the electrical conductors 44, 45. At the same time, the compression spring of the second compressive element 145 in the electrically conductive housing 188 generates the pre-loaded compressive force $F_2$ against the first electrically conductive contact 180 of the pressure sensor 142. The pre-loaded compressive force $F_2$ generates an immediate increase in force on the coaxial probe assembly 140 as represented by the vertical force line $F_2$ extending from the $K_1$ line in FIG. 9B. Likewise, each compression spring of the second compressive element 147 in the electrically conductive housings 203, 204 generates the pre-loaded compressive forces $F_2$ against the first electrically conductive contact 190 of the pressure sensor 143. The resulting combined forces of the compression springs in the electrically conductive housing 203, 204 are substantially equal to the compressive force $F_2$ and the spring constant $K_1$ of the compression spring of the second compressive element 145 in the electrically conductive housing 188 as previously stated. The pre-loaded compressive force $F_2$ generates an immediate increase in force on the coaxial probe assembly 141 as represented by the vertical force line $F_2$ extending from the $K_1$ line in FIG. 9B. This increase in force on the coaxial probe assemblies 140, 141 has a noticeable tactile feel to a user for each coaxial probe assembly 140, 141. The user feels the need to apply greater downward force on the probe housing 100 to move the probe housing relative to the coaxial probe assemblies 140, 141. Further, an increasing downward force is required to move the probe housing 100 relative to the coaxial probe assemblies 140, 141 because of the additive properties of the spring constants of the first and second compressive elements as represented by the sloping line $K_1+K_2$. Continued downward force on the probe housing 100 will cause the first electrically conductive contacts 180, 190 of the pressure sensors 142, 143 to abut the rearward end walls 116, 118 of the recesses 112 114. Any continued downward pressure on the probe housing 100 transfers the force directly to the coaxial probe assemblies 140, 141 as represented by the vertical force line $F_4$ and not taken up by the compression springs.

The first and second pressure sensors 142, 143 function as a logical AND gate for passing the activation signal to the plug receptacles 48, 49. If the first and second electrically conductive contacts 180 and 185 of the first pressure sensor 142 engage prior to the first and second electrically conductive contacts 190 and 196 of the second pressure sensor 143, the activation signal will not be passed to the plug receptacles 48, 49. Likewise, if the first and second electrically conductive contacts 190 and 196 of the second pressure sensor 143 engage prior to the first and second electrically conductive contacts 180 and 185 of the first pressure sensor 142, the activation signal will not be passed to the plug receptacles 48, 49. It is only with the first and second electrically conductive contacts of both the pressure sensors 142, 143 engaged will the activation signal be passed to the plug receptacles 48, 49.

The use of the first compressive elements 144, 146 and the second compressive elements 145, 147 provide increased protection for the components of the coaxial probe assemblies 140, 141 as compared to previous differential measurement probes with movable probing tips or housings. The increase in force required to move the probe housing 100 relative to the coaxial probe assemblies 140, 141 due to the second compressive elements 145, 147 provide a user with a tactile indication that sufficient pressure is being applied to the coaxial probe assemblies 140, 141. Further, the second compressive elements 145, 147 provide a pressure safety zone where additional downward force can be applied to the probe housing 100 without running the risk of causing damage to the coaxial probe assemblies 140, 141. Such a pressure safety zone was not available with the prior art probes.

Referring again to FIG. 5, the adjustment mechanism 210 for varying the distance between the probing tips 151 has a carrier 211 closely receiving the retention block 181 of the first coaxial probe assembly 141. The carrier 211 is preferably a "U" shaped member having a base 212 and sidewalls 213 and 214 extending from the ends of the base 212. Sidewall 213 has a threaded aperture formed therein for receiving a threaded cap screw 215 having a cap head 216 and the threaded shank 217. The threaded cap screw 215 is inserted in the bore 133 of the housing member protrusion 131 with the threaded shank 217 extending into the recess 112 of the channel 106 and screwing into the carrier 211. The cap head 216 of the cap screw 215 sits in a recess formed in the outer surface of the housing member 102. A cap plate 218 fits over this recess and is held in place with a screw 219 that is screwed into the housing member 102. The cap plate 218 closely captures the cap head 216 between the housing member 102 and the cap plate 218 so that there is no axial movement of the cap head 216 in the recess.

The retention block 181 frictionally fits between the sidewalls 213 and 214 of the carrier 211 so that there is no lateral play of the retention block 181 in the carrier 211. The carrier 211 is positioned in the recess 112 of the channels 106 of the housing member 102 and moves laterally across the recess in response to the turning of the cap screw 215. Turning the cap screw 215 clockwise generates pressure to the bottom surface of the cap head 216 by the housing member 102 causing the carrier 211 to move outward towards the housing protrusion 131. Turning the cap screw 215 counter clockwise generates pressure on the top of the cap head 216 by the cap plate 218 causing the carrier to move inward toward the center of the housing member 102. The carrier 211 can retract into the recess 132 formed in the protrusion wall until the retention block 181 abuts the outer side wall of the recess 112. The carrier 211 can be extended across the recess 112 until the retention block 181 abuts the inner side wall of the of the recess 112 with a portion of the carrier moving into the slot 220 formed in the dividing wall 221 between the channels 106 and 107.

Figure 10:
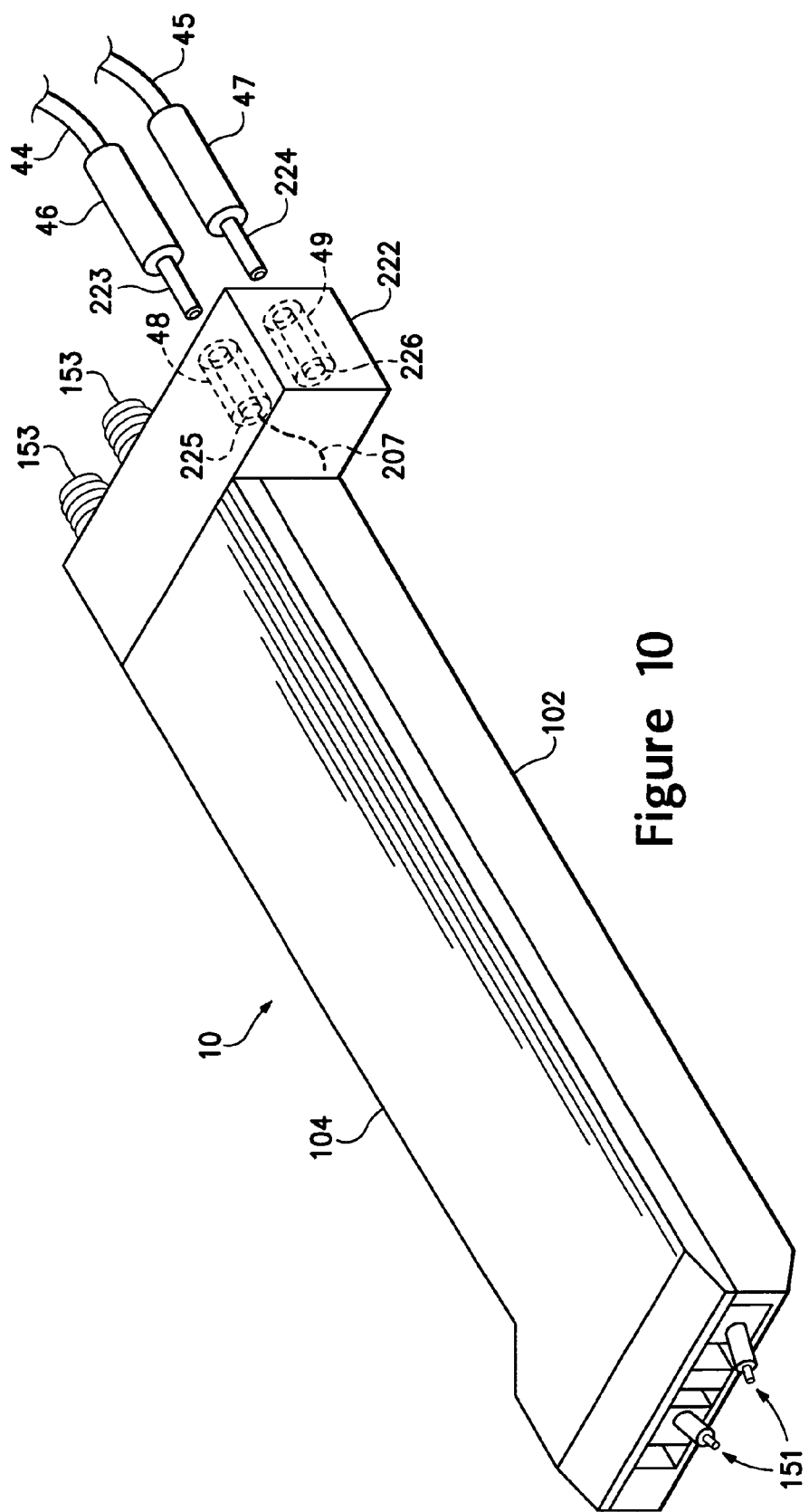
FIG. 10 is a perspective view of the assembled differential measurement probe having retractable double cushioned variable spacing probing tips for passing an activation signal to an EOS/ESD protection control module according to the present invention.

Referring to FIG. 10, there is shown an assembled differential measurement probe 10 having retractable double cushioned variable spacing probing tips for passing an activation signal to first and second electrical over stress (EOS) and electrostatic discharge (ESD) protection control modules 12, 13. The first and second housing members 102, 104 are secured together to captures the coaxial probe assemblies 140, 141 within the housing 100 with the probing tips 151 extending out of end 108 and the coaxial threaded connectors 153 extending out of end 110. The probing tips 151 are angled toward each other such that by movement of one of the probing tips 151 relative to the other using the adjustment mechanism 210 the probing tip spacing can be varied from 0.2 to 4.2 millimeters. To achieve the 0.2 millimeter spacing, the central signal conductors 149 and the outer shielding conductors 150 of probing tips 151 made from the semi-rigid coaxial cables 148 are beveled as shown in greater detail in FIG. 11.

Figure 11:
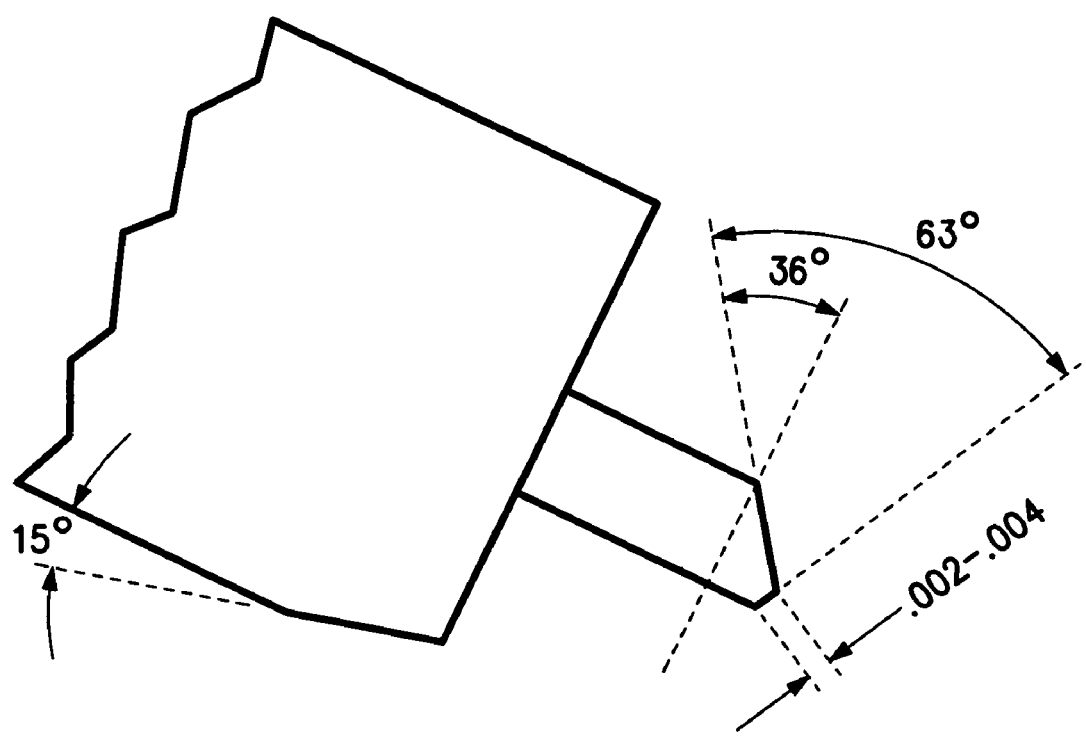
FIG. 11 is a detailed representation of the probing tips in the differential measurement probe having retractable double cushioned variable spacing probing tips for passing an activation signal to an EOS/ESD protection control module according to the present invention.

In FIG. 11 illustrates one of the probing tips 149 of the differential measurement probe 10 having retractable double cushioned variable spacing probing tips. The central signal conductor 149 of the probing tip 151 is beveled at a nominal angle of 36 degrees to face 230 of the semi-rigid coaxial cable 148. A second bevel is made at the probing point 232 of the probing tip 149 having an angle ranging from 45 degrees to 70 degrees to the beveled face of the central signal conductor 149 with the second bevel having a nominal angle of sixty-three degrees. This results in removing the sharp point on the acute angle 232 of the central signal conductor 149. The flat surface produced by the second bevel has a dimension ranging from 0.002 to 0.004 inches with the nominal dimension being 0.003 inches. The use of the second bevel on the central signal conductor 149 adds strength to the probing point 232. The outer shielding conductor 150 is also beveled 234 to allow the probing points 232 of the central signal conductors 149 to come within 0.2 millimeters of each other. The bevel on the outer shielding conductor 150 has a nominal angle of 15 degrees. The bevel angle may be varied according to the diameter of the semi-rigid coaxial cable 148 and the angle of the probing tips 151 relative to the end face of the probe 100. The probing tips 151 are oriented with the beveled surfaces 234 of the outer shielding conductors 150 facing each other.

Positioned over the end 110 of the housing 100 is a bracket 222 that is attached to one of the anti-rotation blocks 156, 157 using threaded screws. Mounted on the bracket are the plug receptacles 48, 49 with each plug receptacle 48, 49 having an electrical contact 225, 226. The second plug connectors 46, 47 of the electrical conductors 44, 45 each have an electrical contact 223, 224 that are electrically connected to the electrical contacts 225, 226 of the plug receptacles 48, 49 when mated. The insulated wire 207 that is electrically coupled to the second electrically conductive contact 196 of the second pressure sensor 143 is electrically coupled to the electrical contacts 225, 226 of the plug receptacles 48, 49 for coupling the activation signal to the control modules 12, 13.

Figure 12:
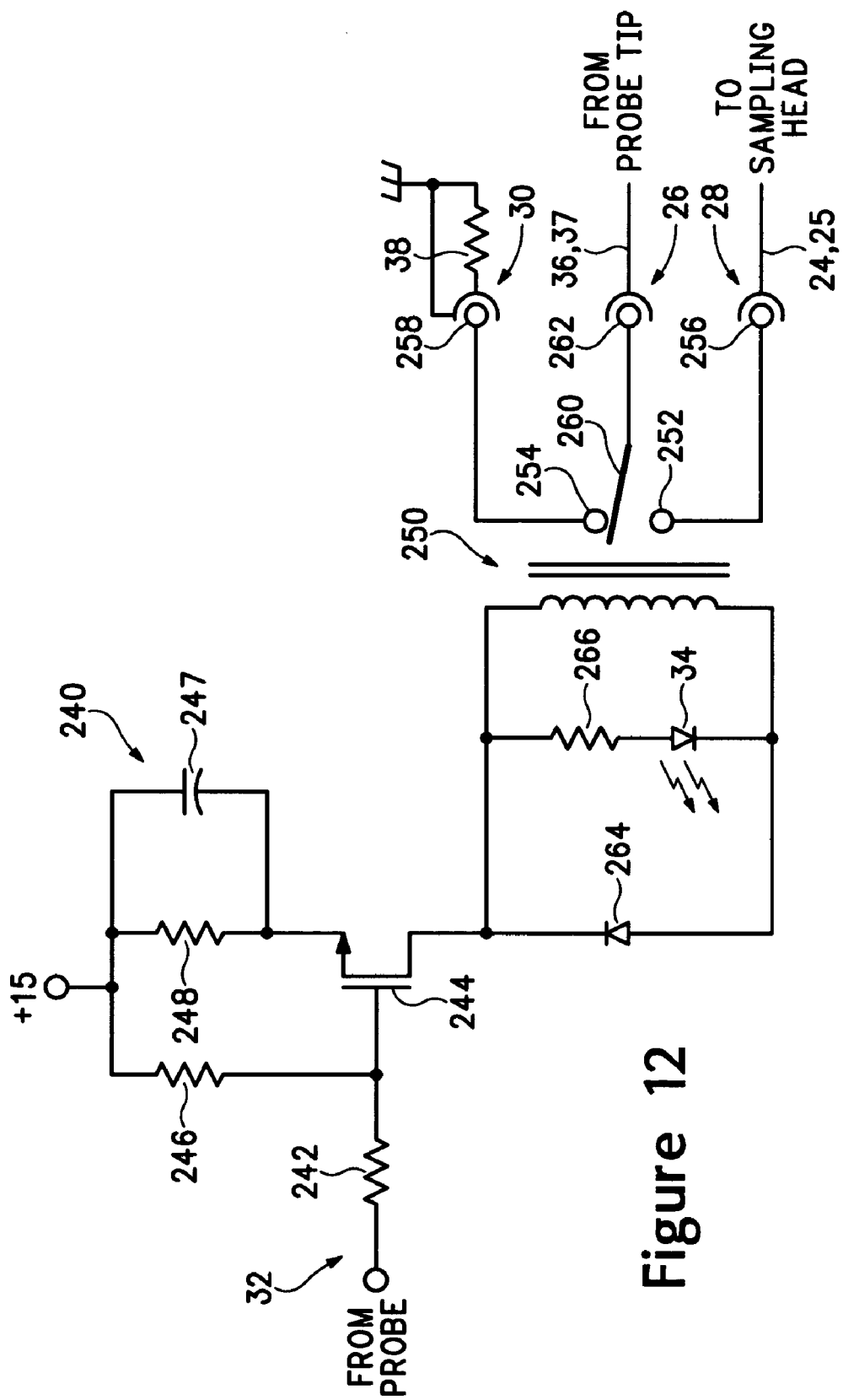
FIG. 12 is a schematic representation of the of the control circuitry in the control modules coupled to the differential measurement probe having retractable double cushioned variable spacing probing tips for passing an activation signal to an EOS/ESD protection control module according to the present invention.

Referring to FIG. 12, there is shown a schematic representation of control circuitry 240 in the control modules 12 and 13. Each control module 12, 13 functions in the same manner and provides EOS/ESD protection to one of the first and second input channels of the sampling head 18 in the measurement test instrument 10. Each control module 12 and 13 receives the activation signal from the differential measurement probe 10 via the electrically conductive input connector 32 connected to respective electrical contacts 42, 43 of the plug connectors 40, 41 that are connected to the electrical conductors 44, 45. The activation signal from the differential measurement probe 10 is coupled through resistor 242 to the control terminal of a high input impedance transconductance device 244. In the preferred embodiment, the high input impedance transconductance device 244 is a p-channel MOS field effect transistor, such as manufactured and sold by Tektronix, Inc. under Part No. 151-1120-00. Alternately, the high input impedance transconductance device 244 may be a CMOS logic gate controlling a power circuit. A bias resistor 246 is coupled between the control terminal of the high input impedance transconductance device 244 and a voltage supply. The voltage supply is also supplied to the current output of the high input impedance transconductance device 244 through power supply resistor 248 and charging capacitor 247. The output of the high input impedance transconductance device 244 is coupled through a RF relay switch 250. Relay switch contacts 252 and 254 are respectively coupled to the signal conductors 256 and 258 of the coaxial output terminal 28 and a coaxial termination terminal 30. The armature contact 260 is coupled to the signal conductor 262 of the coaxial input terminal 26. A shunt diode 264 is coupled in parallel with the RF relay switch 250. A series connected resistor 266 and light emitting diode used as the optional visual indicator 34 may be coupled in parallel with the RF relay switch 250.

The operation of the differential measurement probe 10 will be described with a p-channel MOSFET as the high input impedance transconductance device 244. The spring loaded coaxial probe assemblies 140, 141 of the differential measurement probe 10 are coupled to one of the respective coaxial input terminals 26 of the control modules 12 and 13 via coaxial cables 36 and 37. The central signal conductors 149 of the semi-rigid coaxial cables 148 of the first and second coaxial probe assemblies 140, 141 are coupled to the signal conductors 262 of the coaxial input terminals 26 of the control modules 12 and 13. The outer shielding conductors 150 of the semi-rigid coaxial cables 148 are coupled to electrical ground through the outer shielding conductor of the coaxial cable 36, 37 and the coaxial input terminals 26. The first and second pressure sensors 142, 143 are coupled to the input of the p-channel MOSFETs 244 via the electrical conductors 44, 45 and the contacts 42, 43 of the input connectors 40, 41. The first and second pressure sensors 142, 143 function as a logical AND gate for the input circuitry of the p-channel MOSFET 244. The first and second pressure sensors 142, 143 presents an open circuit to the gate of the p-channel MOSFET in the standby mode when neither of the first and second electrically conductive contacts 180, 185, 190, 196 of the first and second pressure sensors 142, 143 are engaged or when the first and second electrically conductive contacts of one or the other of the first and second pressure sensors 142, 143 are engaged. The open circuit biases the p-channel MOSFET 244 to the off state by coupling supply voltage through the biasing resistor 246 to the gate of the MOSFET.

A user positions the differential measurement probe 10 is on the device under test 54 with the probing tips 151 contacting the circuit traces 50. The probing tips 151 are coupled to electrical ground through the armatures and switch contacts 260 and 254 and the 50 ohm termination resistors 66 of the control modules 12 and 13 to discharge any ESD and EOS voltages on the device under test 54. Pressure applied to the probing tips 151 of the differential measurement probe 10 in contact with a device under test 54 causes movement of the housing 100 relative to the coaxial probe assemblies 140, 141. The movement of the housing 100 brings the second electrically conductive contacts 185, 196 of the first and second pressure sensors 142, 143 into contact with the first electrically conductive contacts 180, 190 of the first and second pressure sensors 142, 143. The engagement of the first and second electrically conductive contacts 180, 185 and 190, 196 of the first and second pressure sensors 142, 143 couples electrical ground into the input circuitry of the p-channel MOSFETs 244 of control modules 12 and 13 producing voltage divider networks that includes biasing resistors 246, input resistors 242 and the resistances of the first or second pressure sensors 142, 143. The voltage drop across biasing resistors 246, which in the preferred embodiment has a high resistive value of approximately 4.7 megohms, causes the p-channel MOSFETs 244 to conduct and apply pull-in currents and voltages to the coils of the RF relays 250 that closes the contacts 260 and 252 of the control modules 12 and 13 and couple the probing tips 154 of the differential measurement probe 10 to the first and second input channels of the sampling head 18. The RF relays 250 requires a 30 ma pull-in current at +15 volts to initially move the armatures 260 from the normally closed contacts 254 to the normally open contacts 252. Smaller holding currents and voltages are supplied to the RF relays 250 of the control modules 12 and 13 by the RC circuits made of charging capacitors 247 and resistors 248. The current outputs of the p-channel MOSFETs are also coupled through resistors 266 and LEDs 34 of the control modules 12 and 13 to provide visual indications that the probing tips 151 are coupled to the channel inputs of sampling head 18.

Reducing the differential measurement probe 10 pressure to the device under test 54 below at least one of the second pre-loaded compressive forces produced by the second compressive elements 145, 147 disengages at least one set of the electrically conductive contacts 180, 185 and 190, 196 of the first and second pressure sensors 142, 143 causing the activation signal from the differential measurement probe 10 to be removed from the input circuits of the p-channel MOSFETs 244 of the control modules 12 and 13. The voltage supplies are reapplied to the gates of the p-channel MOSFETs 244 causing the MOSFETs to shut off and remove the power to the RF coils 250, which in turn couples the probing tips 151 of the differential measurement probe 10 to electrical ground through the 50 ohm termination resistors 66. The currents from the collapsing magnetic fields of the coils are coupled through shunt diodes 264.

Figure 13:
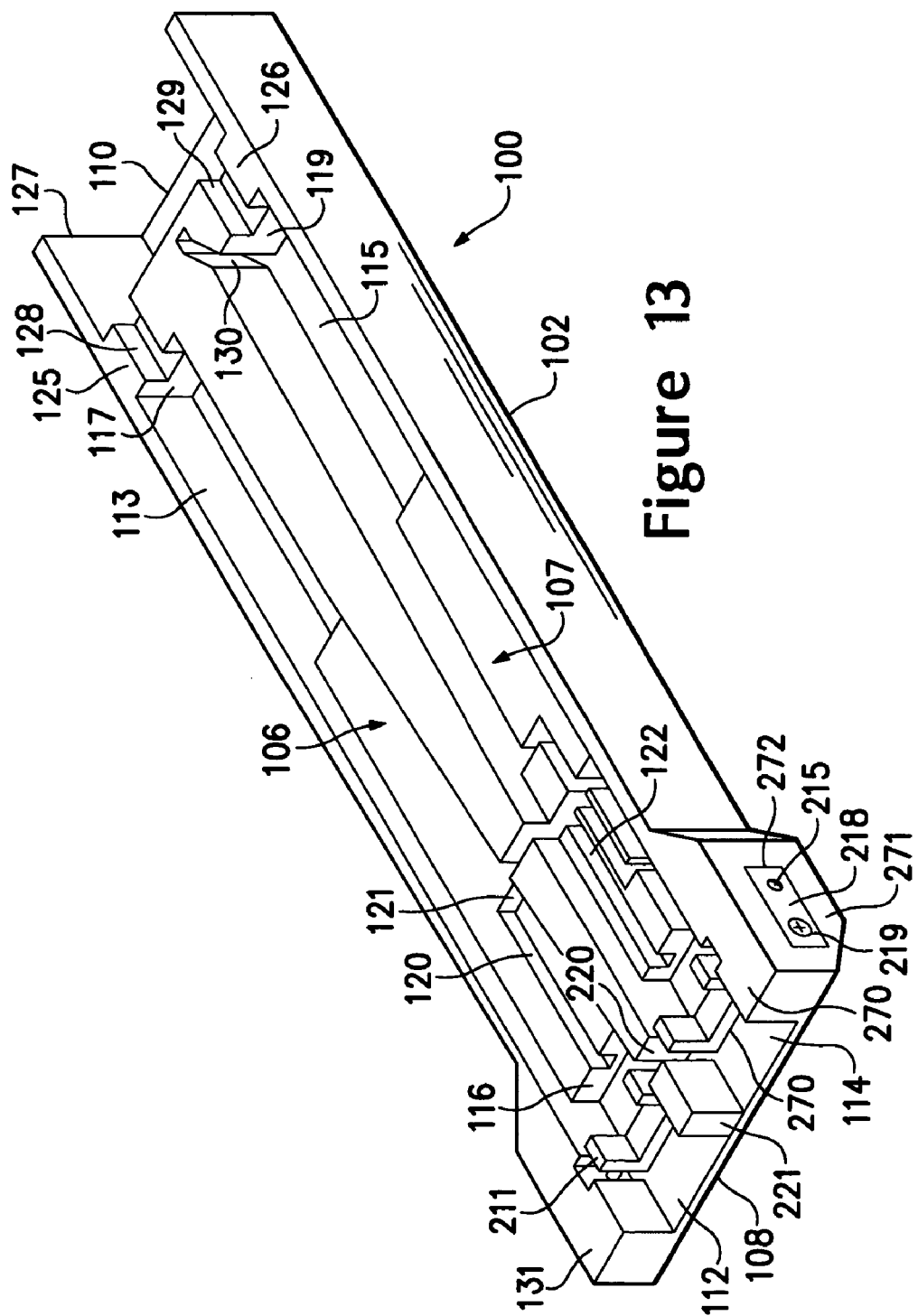
FIG. 13 is a perspective view of a portion of a further embodiment of the differential measurement probe having retractable double cushioned variable spacing probing tips for passing an activation signal to an EOS/ESD protection control module according to the present invention.

Referring to FIG. 13, there is shown a perspective view of a portion of a further embodiment of the differential measurement probe 10 having retractable double cushioned variable spacing probing tips. Like elements from the previous drawings are labeled the same in FIG. 13. The coaxial probe assemblies 140, 141, the pressure sensors 142, 143 and the first and second compressive elements 144, 145, 146, 147 are the same as previously described. The housing member 102 in this embodiment has substantially solid protrusions 131, 270 extending from both sides of the housing member 102. The second protrusion 270 has the same structure as the protrusion 131. The exterior surface 271 of the housing member 102 has a recess 272 formed therein that receives the cap screw 215. The cap plate 218 fits over the recess 272 and is secured to the housing member 102 with the screw 219. The cap screws 215 are threadably connected to carriers 211 and 273. The carrier 273 has the same structure as the carrier 211. The carrier 273 is positioned in the recess 114 of the cannel 107. The carrier 211 receives the retention block 181 of the first coaxial probe assembly and the carrier 273 receives the retention block 191 of the second coaxial probe assembly 141. The turning of the cap screws 215 independently moves the carriers 211, 272 and in turn the probing tips 151 of the coaxial probe assemblies 140, 141 to set the probe spacing between the probing tips 151. The housing member 104 conforms to the peripheral dimensions of the housing member 102 with the two protrusions 131 and 270.

Figure 14:
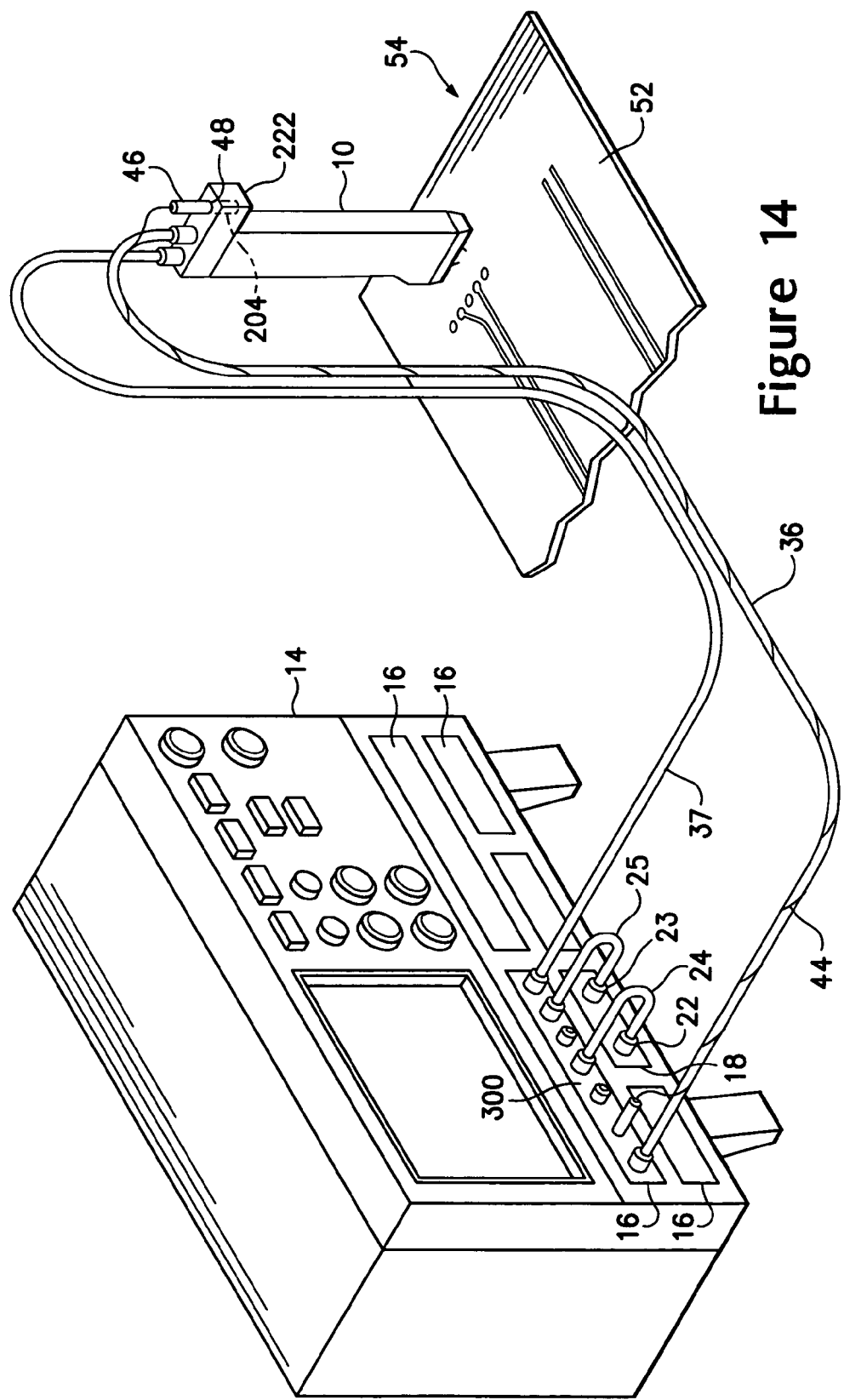
FIG. 14 is a further embodiment of the differential measurement probe having retractable double cushioned variable spacing probing tips for passing an activation signal to an EOS/ESD protection control module according to the present invention.
Figure 15:
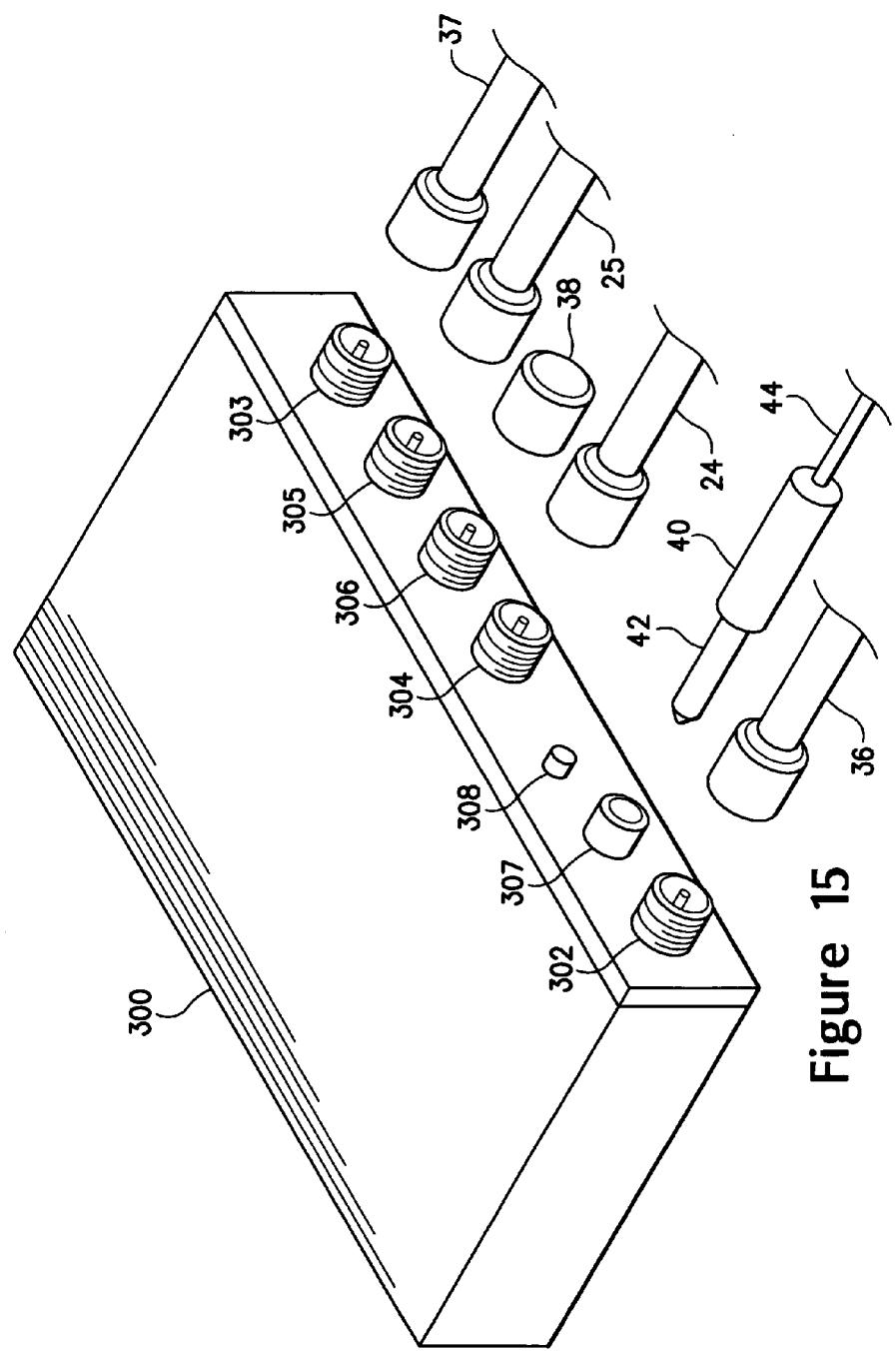
FIG. 15 is a perspective view of another EOS/ESD protection control module coupled to the differential measurement probe having retractable double cushioned variable spacing probing tips for passing an activation signal according to the present invention.

Referring to FIG. 14, there is shown a further embodiment of the differential measurement probe 10 having retractable double cushioned variable spacing probing tips for passing an activation signal to an electrical over stress (EOS) and electrostatic discharge (ESD) protection control module 300. Like elements from the previous drawings are labeled the same in FIG. 14. The first and second control modules 12, 13 of the previous embodiment is replaced with a single control module 300 disposed in a one of the bays 16 of the measurement test instrument 14. The control module 300, as best shown in FIG. 15, has coaxial input terminals 302, 303, coaxial output terminals 304, 305, and a coaxial termination terminal 306. An electrically conductive input connector 307 is also provided in the control module 300. An optional visual indicator 308, such as an LED may be secured to the control module 300 to indicate when the probing tips 151 of the differential measurement probe 10 are coupled to the sampling head 18. The coaxial input terminals 302 and 303 are coupled to the respective ends of the coaxial cables 36 and 37 whose other ends are coupled to the measurement probe 10. The output terminals 304 and 305 are coupled via the coaxial cables 24 and 25 to the input terminals of the sampling head 18. The 50 ohm termination connector 38 is secured to the coaxial termination terminal 306. The electrically conductive plug connector 40 plugs into the input connector 32. The electrical contact 42 of the plug connector 40 is electrically connected to an electrical conductor 44 having a second plug connector 46 at the other end. The second plug connector 46 is plugged into a plug receptacle 48 mounted on the differential measurement probe 10. The plug receptacle 48 on the measurement probe is mounted on the bracket 222 secured to one of the anti-rotation blocks 156, 157 of the differential measurement probe 10. The insulated wire 207 of the differential measurement probe 10 is electrically coupled to the plug receptacle 48.

Figure 16:
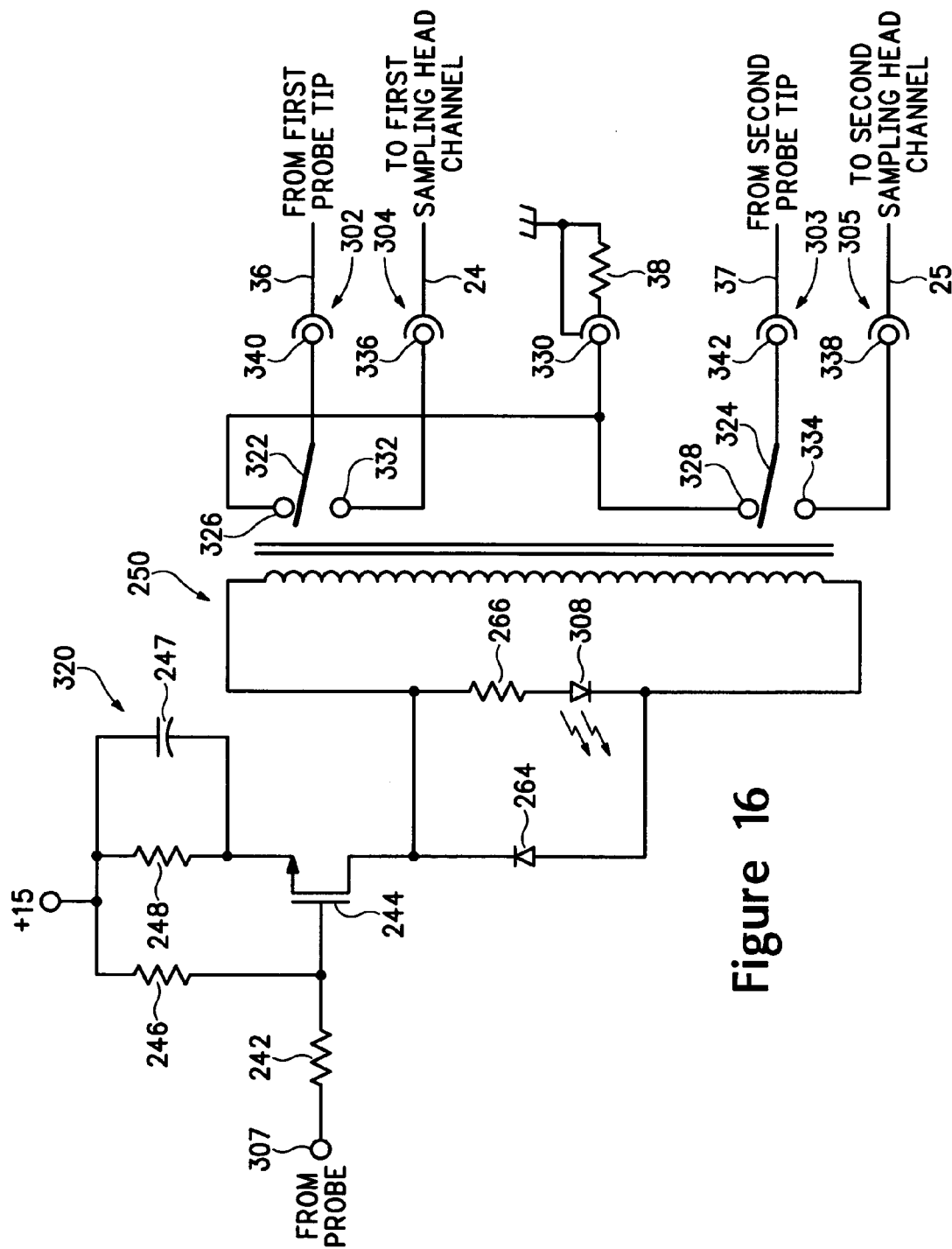
FIG. 16 is a schematic representation of the of the control circuitry in the control module coupled to the differential measurement probe having retractable double cushioned variable spacing probing tips for passing an activation signal to an EOS/ESD protection control module according to the present invention.

FIG. 16 shows a schematic representation of control circuitry 320 in the control module 300. Like elements from the previous drawings are labeled the same in FIG. 16. The control module 300 has the same circuit structure and functions in the same manner as the previously describe control modules 12, 13 with the exception that the RF relay switch 250 has two armatures contacts 322 and 324 instead of one. The control module 300 receives the activation signal from the differential measurement probe 10 via the electrically conductive input connector 32 connected to the electrical contact 42 of the plug connector 40 that are connected to the electrical conductor 44. Relay switch contacts 326 and 328 are coupled to the signal conductor 330 of the coaxial termination terminal 306. Relay switch contacts 332, and 334 are respectively coupled to the signal conductors 336 and 338 of the coaxial output terminals 304 and 305. The armatures contacts 322 and 324 are respectively coupled to the signal conductors 340 and 342 of the coaxial input terminals 302 and 303. In operation, the armature contacts 322 and 324 of the RF relay switch 250 are coupled to the 50 ohm termination connector 38 via the relay switch contacts 326 and 328 when the MOSFET 244 is not conducting. The activation signal causes the MOSFET 244 to conduct and apply a pull-in current and voltage to the coil of the RF relay 250 that closes the contacts 322 and 332 and 324 and 334 of the control module 300 and couple the probing tips 151 of the differential measurement probe 10 to the first and second input channels of the sampling head 18.

The present invention has been described with a electrical ground activation signal. The present invention may also be implemented using a positive or negative voltage activation signal if voltage power is provided to the measurement probe 10. In such a configuration, the first electrically conductive contacts 180 and 190 of the first and second pressure sensors 142 and 143 need to electrically insulated from the semi-rigid coaxial cables 148 with the voltage activation signal being coupled to one of the second electrically conductive elements 185 or 196 of the first and second pressure sensors 142, 143. Further, various configurations of the first and second compressive elements 144, 146 and 145, 147 have been described. Other configurations of the first and second compressive elements 144, 146 and 145, 147 using different compressive materials, such as elastomers or the like, are contemplated where the first compressive elements generates an initial pre-loaded and increasing compressive force on the coaxial probe assemblies 140, 141 and the second compressive elements generates a second pre-loaded compressive force on the coaxial probe assemblies 140, 141 and adds an increasing compressive force on the coaxial probe assemblies 140, 141.

It will be obvious to those having skill in the art that many changes may be made to the details of the above-described embodiments of this invention without departing from the underlying principles thereof. The scope of the present invention should, therefore, be determined only by the following claims.

What is claimed is:

1. A differential measurement probe having variable spacing probing tips comprising:
    first and second coaxial probe assemblies with each coaxial probe assembly having a probing tip;
    a housing receiving the first and second coaxial probe assemblies with the probing tips of the first and second coaxial probe assemblies extending from one end of the housing;
    first compressible elements disposed within the housing with one of the first compressible elements applying a first pre-loaded compressive force to the first coaxial probe assembly and a first increasing compressive force by axial movement of the housing relative to the first coaxial probe assembly and the other of the first compressible elements applying a first pre-loaded compressive force to the second coaxial probe assembly and a first increasing compressive force by axial movement of the housing relative to the second coaxial probe assembly;
    second compressible elements disposed within the housing with one of the second compressible elements applying a second pre-loaded compressive force to the first coaxial probe assembly subsequent to the application of the first increasing compressive force on the first coaxial probe assembly and a second increasing compressive force by further axial movement of the housing relative to the first coaxial probe assembly and the other of the second compressible elements applying a second pre-loaded compressive force to the second coaxial probe assembly subsequent to the application of the first increasing compressive force on the second coaxial probe assembly and a second increasing compressive force by further axial movement of the housing relative to the second coaxial probe assembly;
    first and second pressure sensors disposed in the housing for passing an activation signal in response to the axial movement of the housing relative to the first and second coaxial probe assemblies with each of the first and second pressure sensors having a first contact associated with each of the respective coaxial probe assemblies and a second contact associated with the housing; and
    at least a first adjustment mechanism disposed in the housing and mechanically coupled to one of the first and second coaxial probe assemblies for varying the probe tip spacing of the probing tips of the semi-rigid coaxial cables of the first and second coaxial probe assemblies.

2. The differential measurement probe as recited in claim 1 wherein the each of the first and second coaxial probe assemblies further comprise a semi-rigid coaxial cable having a probing tip at one end and a threaded connector at the other end with the probing tip end of the semi-rigid coaxial cable having a curved portion that transitions to a straight portion at the probing tip for angling the probing tips of the semi-rigid coaxial cables toward each other at the one end of the housing and the threaded connector of each of the semi-rigid coaxial cables extending the other end of the housing.

3. The differential measurement probe as recited in claim 1 wherein the housing further comprises first and second members with at least one member having first and second channels formed therein for receiving the first and second coaxial probe assemblies, the first compressible elements, the second compressible elements, the first and second pressure sensors and at least the first adjustment mechanism with the first and second members being joined together to form an internal cavity.

4. The differential measurement probe as recited in claim 2 wherein each of the first compressible elements further comprises a compression spring positioned on the semi-rigid coaxial cable of each of the first and second coaxial probe assemblies with one end of the compression spring fixedly positioned to the semi-rigid coaxial cable and the other end engaging the housing with the compression spring being compressed between the fixed position on the semi-rigid coaxial cable and the housing to generate the first pre-loaded compressive force.

5. The differential measurement probe as recited in claim 2 wherein each first contact of the first and second pressure sensors further comprises a first electrically conductive contact with one of the first electrically conductive contacts electrically coupled to the outer shielding conductor of one of the semi-rigid coaxial cables of the first and second coaxial probe assemblies and the other first electrically conductive contact being electrically insulated from the outer shielding conductor of the other semi-rigid coaxial cable of the first and second coaxial probe assembly and each second contact of the first and second pressure sensors further comprising a second electrically conductive contact disposed in the housing.

6. The differential measurement probe as recited in claim 5 wherein the first electrically conductive contact of one of the first and second pressure sensors further comprises a first retention block disposed adjacent to the probing tip of one of the semi-rigid coaxial cables of the first and second coaxial probe assemblies with the first retention block having a curved slot disposed between opposing straight sections for receiving the respective curved portion of the semi-rigid coaxial cable and the first electrically conductive contact of the other first and second pressure sensors further comprises a conductive member disposed adjacent to and electrically insulated from a second retention block with the second retention block disposed adjacent to the probing tip of the other of the semi-rigid coaxial cables of the first and second coaxial probe assemblies with the second retention block having a curved slot disposed between opposing straight sections for receiving the respective curved portion of the semi-rigid coaxial cable first and second coaxial probe assemblies.

7. The differential measurement probe as recited in claim 6 wherein the first adjustment mechanism further comprises a carrier having a threaded aperture therein with the carrier receiving one of the first and second retention blocks disposed adjacent to the probing tips of the semi-rigid coaxial cables of the first and second coaxial probe assemblies and a threaded screw having a screw head attached to a threaded shank with the screw head being received and captured in a recess in the exterior surface of the housing and the threaded shank passing through an aperture in the housing and engaging the threaded aperture in the carrier.

8. The differential measurement probe as recited in claim 7 wherein the carrier further comprises a "U" shaped member having a base and sidewalls with the retention block being closely received in the "U" shaped member.

9. The differential measurement probe as recited in claim 7 further comprising a second adjustment mechanism wherein the second adjustment mechanism further comprises a carrier having a threaded aperture therein with the carrier receiving the other of the first and second retention blocks disposed adjacent to the probing tips of the semi-rigid coaxial cables of the first and second coaxial probe assemblies and a threaded screw having a screw head attached to a threaded shank with the screw head being received and captured in a recess in the exterior surface of the housing and the threaded shank passing through an aperture in the housing and engaging the threaded aperture in the carrier.

10. The differential measurement probe as recited in claim 9 wherein the carrier further comprises a "U" shaped member having a base and sidewalls with the retention block being closely received in the "U" shaped member.

11. The differential measurement probe as recited in claim 5 wherein the first and second pressure sensors produce a logical AND function when the first electrically conductive contacts of the first and second pressure sensors engage the second electrically conductive contacts of the first and second pressure sensors.

12. The differential measurement probe as recited in claim 11 wherein one of the second electrically conductive contacts of the first and second pressure sensors further comprises a common electrically conductive contact for electrically coupling the second electrically conductive contacts together through one of the first electrically conductive contacts of the first and second pressure sensors.

13. The differential measurement probe as recited in claim 12 wherein each of the second compressible elements further comprises a compression spring disposed within a bore of an electrically conductive housing having a movable electrical contact secured within the bore with the compression spring being compressed between the electrically conductive housing and the movable electrical contact to generate the second pre-loaded compressive force.

14. The differential measurement probe as recited in claim 13 wherein each of the electrically conductive housings receiving the compression spring and securing the movable electrical contact further comprises one of the second electrically conductive contacts of the first and second pressure sensors.

15. The differential measurement probe as recited in claim 2 wherein each of the first and second coaxial probe assemblies further comprises an attachment plate disposed on the semi-rigid coaxial cable adjacent to the threaded connector with the attachment plate secured to an anti-rotation block, the anti-rotation block being positioned within the housing.

16. The differential measurement probe as recited in claim 15 further comprising an electrical conductor coupled to one of the first and second pressure sensors.

17. The differential measurement probe as recited in claim 16 further comprising an electrical connector receptacle mounted on the differential measurement probe having an electrical contact electrically coupled to the electrical conductor.

18. The differential measurement probe as recited in claim 17 wherein the electrical connector receptacle is mounted on a bracket having a top plate and depending sidewalls with the bracket secured to one of the attachment plates.

19. The differential measurement probe as recited in claim 16 further comprising first and second electrical connector receptacles mounted on the differential measurement probe with each electrical connector receptacles having and electrical contact electrically coupled to the electrical conductor.

20. The differential measurement probe as recited in claim 19 wherein the first and second electrical connector receptacles are mounted on a bracket having a top plate and depending sidewalls with the bracket secured to one of the attachment plates.

21. A differential measurement probe having variable spacing probing tips coupled via first and second coaxial cables to at least a first electrical over stress and electrostatic discharge protection module with the differential measurement probe passing an activation signal to the electrical over stress and electrostatic discharge protection control module for coupling the differential measurement probe to input circuitry of the measurement test instrument comprising:

first and second coaxial probe assemblies with each coaxial probe assembly formed from a semi-rigid coaxial cable having a probing tip at one end and a threaded connector at the other end with the threaded connector being coupled to the coaxial cable with the probing tip end of the semi-rigid coaxial cable having a curved portion that transitions to a straight portion at the probing tip for angling the probing tips of the semi-rigid coaxial cables toward each other;

a housing having an internal cavity extending the length of the housing and exposed at opposing ends of the housing with the first and second coaxial probe assemblies disposed within the internal cavity having the probing tips of the first and second coaxial probe assemblies extending from one end of the housing and the threaded connectors of the first and second coaxial probe assemblies extending from the other end of the housing;

first compressible elements disposed within the housing with one of the first compressible elements applying a first pre-loaded compressive force to the first coaxial probe assembly and a first increasing compressive force by axial movement of the housing relative to the first coaxial probe assembly and the other of the first compressible elements applying a first pre-loaded compressive force to the second coaxial probe assembly and a first increasing compressive force by axial movement of the housing relative to the second coaxial probe assembly; and second compressible elements disposed within the housing with one of the second compressible elements applying a second pre-loaded compressive force to the first coaxial probe assembly subsequent to the application of the first increasing compressive force on the first coaxial probe assembly and a second increasing compressive force by further axial movement of the housing relative to the first and coaxial probe assembly and the other of the second compressible elements applying a second pre-loaded compressive force to the second coaxial probe assembly subsequent to the application of the first increasing compressive force on the second coaxial probe assembly and a second increasing compressive force by further axial movement of the housing relative to the second coaxial probe assembly;

first and second pressure sensors passing an activation signal in response to the axial movement of the housing relative to the first and second coaxial probe assemblies with each of the first and second pressure sensors having a first electrically conductive contact with one of the first electrically conductive contacts electrically coupled to the outer shielding conductor of one of the semi-rigid coaxial cables of the first and second coaxial probe assemblies and the other first electrically conductive contact being electrically insulated from the outer shielding conductor of the other semi-rigid coaxial cable of the first and second coaxial probe assembly, and a second electrically conductive contact disposed in the housing with one of the second electrically conductive contacts of the first and second pressure sensors coupled to the electrical over stress and electrostatic discharge protection control module via an electrical conductor;

at least a first adjustment mechanism disposed in the housing and mechanically coupled to one of the first and second coaxial probe assemblies for varying the probe tip spacing of the probing tips of the semi-rigid coaxial cables of the first and second coaxial probe assemblies;

the probing tips of the first and second coaxial probe assemblies coupled to electrical ground via the electrical over stress and electrostatic discharge protection control module prior to the first electrically conductive contacts of the first and second pressure sensors engaging the second electrically conductive contacts of the first and second pressure sensors and the probing tips coupled to the input circuitry of the measurement test instrument when the electrical over stress and electrostatic discharge protection control module receives the activation signal passed in response to the first electrically conductive contacts of the first and second pressure sensors engaging the second electrically conductive contacts of the first and second pressure sensors.

22. The differential measurement probe as recited in claim 21 wherein the housing further comprises first and second members with at least one member having first and second channels formed therein for receiving the first and second coaxial probe assemblies, the first compressible elements, the second compressible elements, the first and second pressure sensor and at least the first adjustment mechanism with the first and second members being joined together such form the internal cavity.

23. The differential measurement probe as recited in claim 21 wherein each of the first compressible elements further comprises a compression spring positioned on the semi-rigid coaxial cable of each of the first and second coaxial probe assemblies with one end of the compression spring fixedly positioned to the semi-rigid coaxial cable and the other end engaging the housing with the compression spring being compressed between the fixed position on the semi-rigid coaxial cable and the housing to generate the first pre-loaded compressive force.

24. The differential measurement probe as recited in claim 21 wherein the first electrically conductive contact of one of the first and second pressure sensors further comprises a first retention block disposed adjacent to the probing tip of one of the semi-rigid coaxial cables of the first and second coaxial probe assemblies with the first retention block having a curved slot disposed between opposing straight sections for receiving the respective curved portion of the semi-rigid coaxial cable and the first electrically conductive contact of the other first and second pressure sensors further comprises a conductive member disposed adjacent to and electrically insulated from of a second retention block with the second retention block disposed adjacent to the probing tip of the other of the semi-rigid coaxial cables of the first and second coaxial probe assemblies with the second retention block having a curved slot disposed between opposing straight sections for receiving the respective curved portion of the semi-rigid coaxial cable first and second coaxial probe assemblies.

25. The differential measurement probe as recited in claim 24 wherein the first adjustment mechanism further comprises a carrier having a threaded aperture therein with the carrier receiving one of the first and second retention blocks disposed adjacent to the probing tips of the semi-rigid coaxial cables of the first and second coaxial probe assemblies and a threaded screw having a screw head attached to a threaded shank with the screw head being received and captured in a recess in the exterior surface of the housing and the threaded shank passing through an aperture in the housing and engaging the threaded aperture in the carrier.

26. The differential measurement probe as recited in claim 25 wherein the carrier further comprises a "U" shaped member having a base and sidewalls with the retention block being closely received in the "U" shaped member.

27. The differential measurement probe as recited in claim 25 further comprising a second adjustment mechanism wherein the second adjustment mechanism further comprises a carrier having a threaded aperture therein with the carrier receiving the other of the first and second retention blocks disposed adjacent to the probing tips of the semi-rigid coaxial cables of the first and second coaxial probe assemblies and a threaded screw having a screw head attached to a threaded shank with the screw head being received and captured in a recess in the exterior surface of the housing and the threaded shank passing through an aperture in the housing and engaging the threaded aperture in the carrier.

28. The differential measurement probe as recited in claim 27 wherein the carrier further comprises a "U" shaped member having a base and sidewalls with the retention block being closely received in the "U" shaped member.

29. The differential measurement probe as recited in claim 28 wherein the first and second pressure sensors produce a logical AND function when the first electrically conductive contacts of the first and second pressure sensors engage the second electrically conductive contacts of the first and second pressure sensors.

30. The differential measurement probe as recited in claim 29 wherein one of the second electrically conductive contacts of the first and second pressure sensors further comprises a common electrically conductive contact for electrically coupling the second electrically conductive contacts together through one of the first electrically conductive contacts of the first and second pressure sensors.

31. The differential measurement probe as recited in claim 30 wherein each of the second compressible elements further comprises a compression spring disposed within a bore of an electrically conductive housing having a movable electrical contact secured within the bore with the compression spring being compressed between the electrically conductive housing and the movable electrical contact to generate the second pre-loaded compressive force.

32. The differential measurement probe as recited in claim 31 wherein each of the electrically conductive housings receiving the compression spring and securing the movable electrical contact further comprises one of the second electrically conductive contacts of the first and second pressure sensors.

33. The differential measurement probe as recited in claim 21 wherein each of the first and second coaxial probe assemblies further comprises an attachment plate disposed on the semi-rigid coaxial cable adjacent to the threaded connector with the attachment plate secured to an anti-rotation block, the anti-rotation block being positioned within the housing.

34. The differential measurement probe as recited in claim 33 wherein the electrical conductor further comprises first and second insulated wire segments with the first insulated wire segment electrically coupling one of the second electrically conductive contacts of the first and second pressure sensors to an electrical contact of an electrical connector receptacle mounted on the differential measurement probe, and the second insulated wire segment electrically coupling an electrical contact of a first electrical plug to an electrical contact of a second electrical plug with the first electrical plug mating with the electrical connector receptacle mounted on the differential measurement probe and the second electrical plug mating with an electrical connector receptacle having an electrical contact mounted in the electrical over stress and electrostatic discharge protection control module.

35. The differential measurement probe as recited in claim 34 wherein electrical connector receptacle is mounted on a bracket having a top plate and depending sidewalls with the bracket secured to one of the attachment plates.

36. The differential measurement probe as recited in claim 33 wherein the first coaxial cable couples the differential measurement probe to a first electrical over stress and electrostatic discharge protection control module and the second coaxial cable couples the differential measurement probe to a second electrical over stress and electrostatic discharge protection control module with the differential measurement probe passing the activation signal to the first and second electrical over stress and electrostatic discharge protection control modules, wherein the electrical conductor further comprises a first insulated wire segment electrically coupling one of the second electrically conductive contacts of the first and second pressure sensors to respective electrical contacts of first and second electrical connector receptacles mounted on the differential measurement probe and second and third insulated wire segments with each second and third insulated wire segment having first and second electrical plugs with each first and second electrical plug having an electrical contact, the electrical contact of the first electrical plug of the second insulated wire mating with the electrical contact of the first electrical connector receptacle mounted on the differential measurement probe and the electrical contact of the second electrical plug of the second insulating wire mating with an electrical contact of an electrical connector receptacle mounted in the first electrical over stress and electrostatic discharge protection control module and the electrical contact of the first electrical plug of the third insulated wire mating with the electrical contact of the second electrical connector receptacle mounted on the differential measurement probe and the electrical contact of the second electrical plug of the third insulating wire mating with an electrical contact of an electrical connector receptacle mounted in the second electrical over stress and electrostatic discharge protection control module.

37. The differential measurement probe as recited in claim 36 wherein first and second electrical connector receptacles are mounted on a bracket having a top plate and depending sidewalls with the bracket secured to one of the attachment plates.

* * * * *